(12) United States Patent
Lee et al.

(10) Patent No.: US 12,062,647 B2
(45) Date of Patent: Aug. 13, 2024

(54) SEMICONDUCTOR PACKAGE

(71) Applicant: SAMSUNG ELECTRONICS CO., LTD., Suwon-si (KR)

(72) Inventors: Daeho Lee, Hwaseong-si (KR); Jinhyun Kim, Yongin-si (KR); Wansoo Park, Seoul (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 203 days.

(21) Appl. No.: 17/457,660

(22) Filed: Dec. 5, 2021

(65) Prior Publication Data
US 2022/0320053 A1 Oct. 6, 2022

(30) Foreign Application Priority Data

Apr. 5, 2021 (KR) .................. 10-2021-0044148

(51) Int. Cl.
*H01L 25/10* (2006.01)
*H01L 23/00* (2006.01)
*H01L 23/498* (2006.01)

(52) U.S. Cl.
CPC ...... *H01L 25/105* (2013.01); *H01L 23/49822* (2013.01); *H01L 23/49833* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2225/1023* (2013.01)

(58) Field of Classification Search
CPC . H01L 25/105; H01L 24/16; H01L 23/49822; H01L 23/49833; H01L 24/32; H01L 24/73; H01L 2224/16227; H01L 2224/32225; H01L 2224/73204; H01L 2225/1023
USPC ........................................ 257/737
See application file for complete search history.

(56) References Cited

U.S. PATENT DOCUMENTS

| 9,396,300 | B2 | 7/2016 | Wang et al. |
| 9,589,936 | B2 | 3/2017 | Zhai et al. |
| 9,735,131 | B2 | 8/2017 | Su et al. |

(Continued)

FOREIGN PATENT DOCUMENTS

| KR | 101346420 | 1/2014 |
| KR | 101916613 | 11/2018 |

*Primary Examiner* — Jasmine J Clark
(74) *Attorney, Agent, or Firm* — F. CHAU & ASSOCIATES, LLC

(57) ABSTRACT

A semiconductor package includes a first redistribution substrate, a first semiconductor chip disposed on the first redistribution substrate, a first mold layer that covers the first semiconductor chip and the first redistribution substrate, a second redistribution substrate disposed on the first mold layer, a second semiconductor chip disposed on the second redistribution substrate, where the second semiconductor chip includes a second-chip first conductive bump that does not overlap the first semiconductor chip, a first sidewall that overlaps the first semiconductor chip, and a second sidewall that does not overlap the first semiconductor chip, wherein the first sidewall and the second sidewall are opposite to each other, and a first mold via that penetrates the first mold layer connects the second-chip first conductive bump to the first redistribution substrate, and overlaps the second-chip first conductive bump.

20 Claims, 21 Drawing Sheets

(56) References Cited

U.S. PATENT DOCUMENTS

| | | |
|---|---|---|
| 10,120,150 B2 | 11/2018 | Ding et al. |
| 10,563,641 B2 | 2/2020 | Kim et al. |
| 10,840,197 B2 | 11/2020 | Hsu et al. |
| 10,847,505 B2 | 11/2020 | Lai et al. |
| 2009/0053858 A1* | 2/2009 | Ko .................... H01L 25/0657 |
| | | 438/118 |
| 2020/0357770 A1* | 11/2020 | Chiang .................. H01L 24/49 |

* cited by examiner

SEMICONDUCTOR PACKAGE

CROSS-REFERENCE TO RELATED APPLICATION

This U.S. nonprovisional application claims priority under 35 U.S.C § 119 from Korean Patent Application No. 10-2021-0044148, filed on Apr. 5, 2021 in the Korean Intellectual Property Office, the contents of which are herein incorporated by reference in their entirety.

TECHNICAL FIELD

Embodiments of the present inventive concepts are directed to a semiconductor package.

DISCUSSION OF THE RELATED ART

A semiconductor package implements an integrated circuit chip for use in electronic products. A semiconductor package is typically configured such that a semiconductor chip is mounted on a printed circuit board (PCB) and bonding wires or bumps are used to electrically connect the semiconductor chip to the printed circuit board.

When a high-capacity chip increases in size, an increase in package size is needed due to limitations of chip arrangement and bonding structures. In a package-on-package (POP) structure in which a through-silicon-via (TSV) is used, when chips are formed, circuits are configured at locations far away from TSV regions such that the structure increases the chip size, process cost, and routing length.

SUMMARY

Some embodiments of the present inventive concepts provide a highly integrated semiconductor package with excellent performance and high capacity.

According to some embodiments of the present inventive concepts, a semiconductor package includes: a first redistribution substrate; a first semiconductor chip disposed on the first redistribution substrate; a first mold layer that covers the first semiconductor chip and the first redistribution substrate; a second redistribution substrate disposed on the first mold layer; a second semiconductor chip disposed on the second redistribution substrate, where the second semiconductor chip include a second-chip first conductive bump that does not overlap the first semiconductor chip, a first sidewall that overlaps the first semiconductor chip and a second sidewall that does not overlap the first semiconductor chip, where the first sidewall and the second sidewall are opposite to each other; and a first mold via that penetrates the first mold layer, connects the second-chip first conductive bump to the first redistribution substrate, and overlaps the second-chip first conductive bump.

According to some embodiments of the present inventive concepts, a semiconductor package includes: a first redistribution substrate; a first semiconductor chip disposed on the first redistribution substrate; a first mold layer that covers the first semiconductor chip and the first redistribution substrate; a second redistribution substrate disposed on the first mold layer; a second semiconductor chip disposed on the second redistribution substrate, wherein a portion of the second semiconductor chip overlaps a portion of the first semiconductor chip; a first mold via at a side of the first semiconductor chip, where the first mold via penetrates the first mold layer and overlaps the second semiconductor chip; and a second mold via spaced apart from the first mold via and that penetrates the first mold layer at a location that does not overlap either of the first semiconductor chip or the second semiconductor chip. The second semiconductor chip includes: a second-chip first conductive bump that does not overlap the first semiconductor chip and is connected to the first mold via; and a second conductive bump that overlaps the first semiconductor chip and is connected to the second mold via. The first mold via overlaps the second-chip first conductive bump. The second redistribution substrate includes a redistribution pattern that connects the second-chip second conductive bump to the second mold via.

According to some embodiments of the present inventive concepts, a semiconductor package includes: a first redistribution substrate, a first semiconductor chip, a second redistribution substrate, a second semiconductor chip, a third redistribution substrate, and a third semiconductor chip that are sequentially stacked; a first mold layer interposed between the first redistribution substrate and the second redistribution substrate; a second mold layer interposed between the second redistribution substrate and the third redistribution substrate; a first mold via and a second mold via that penetrate the first mold layer and are spaced apart from each other; and a third mold via that penetrates the second mold layer. The first semiconductor chip, the second semiconductor chip, and the third semiconductor chip may be offset from each other in a first direction. The second semiconductor chip may be connected through the first mold via to the first redistribution substrate. The third semiconductor chip may be connected to the first redistribution substrate through the third mold via and the second mold via, and the third mold via and the second mold via are vertically aligned with each other.

According to some embodiments of the present inventive concepts, a semiconductor package includes: a first redistribution substrate; a first semiconductor chip disposed on the first redistribution substrate; a first mold layer that covers the first semiconductor chip and the first redistribution substrate; a second redistribution substrate disposed on the first mold layer; a second semiconductor chip disposed on the second redistribution substrate, where a portion of the second semiconductor chip overlaps a portion of the first semiconductor chip, where the second semiconductor chip includes a second-chip first conductive bump and a second-chip second conductive bump that do not overlap the first semiconductor chip; a first mold via that penetrates the first mold layer and connects the second-chip first conductive bump to the first redistribution substrate; and a second mold via that penetrates the first mold layer and connects the second-chip second conductive bump to the first redistribution substrate. The second-chip second conductive bump is not vertically aligned with the second mold via.

DETAILED DESCRIPTION OF EMBODIMENTS

Some embodiments of the present inventive concepts will now be described in detail with reference to the accompanying drawings to aid in clearly explaining the present inventive concepts. In this description, such terms as "first" and "second" may be used to simply distinguish identical or similar components from each other, and the sequence of such terms may be changed in accordance with the order of mention. In this description, the expression "conductive bump" may be called "conductive pad." Alternatively, in this description, the expression "conductive bump" or "bonding pad" may be called "pin." Moreover, in this description, the term "conductive pattern" may indicate "conductive bump", "bonding pad", or "internal connection member."

Figure 1:
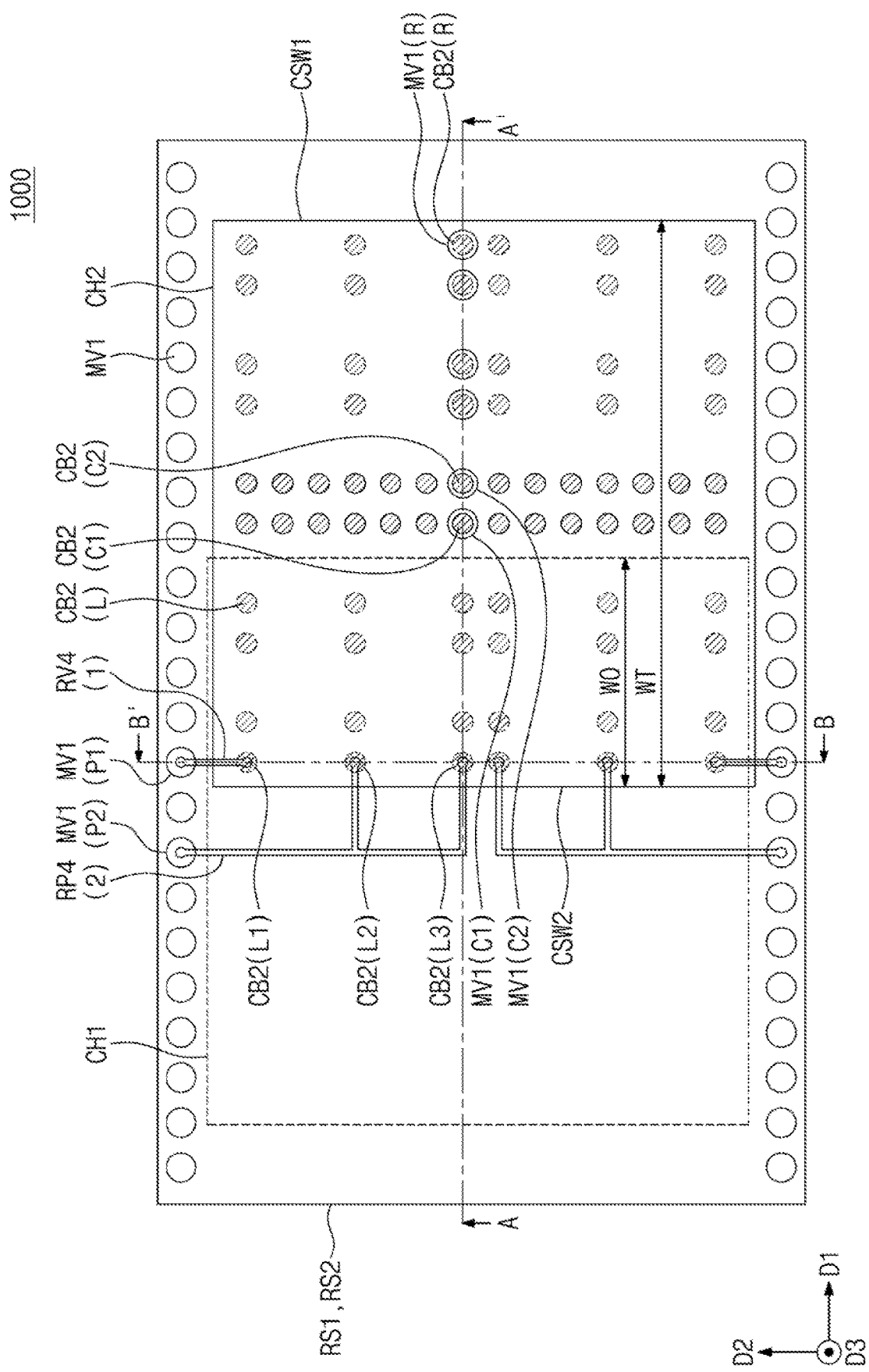
FIG. 1 is a plan view of a semiconductor package according to some embodiments of the present inventive concepts.
Figure 2A:
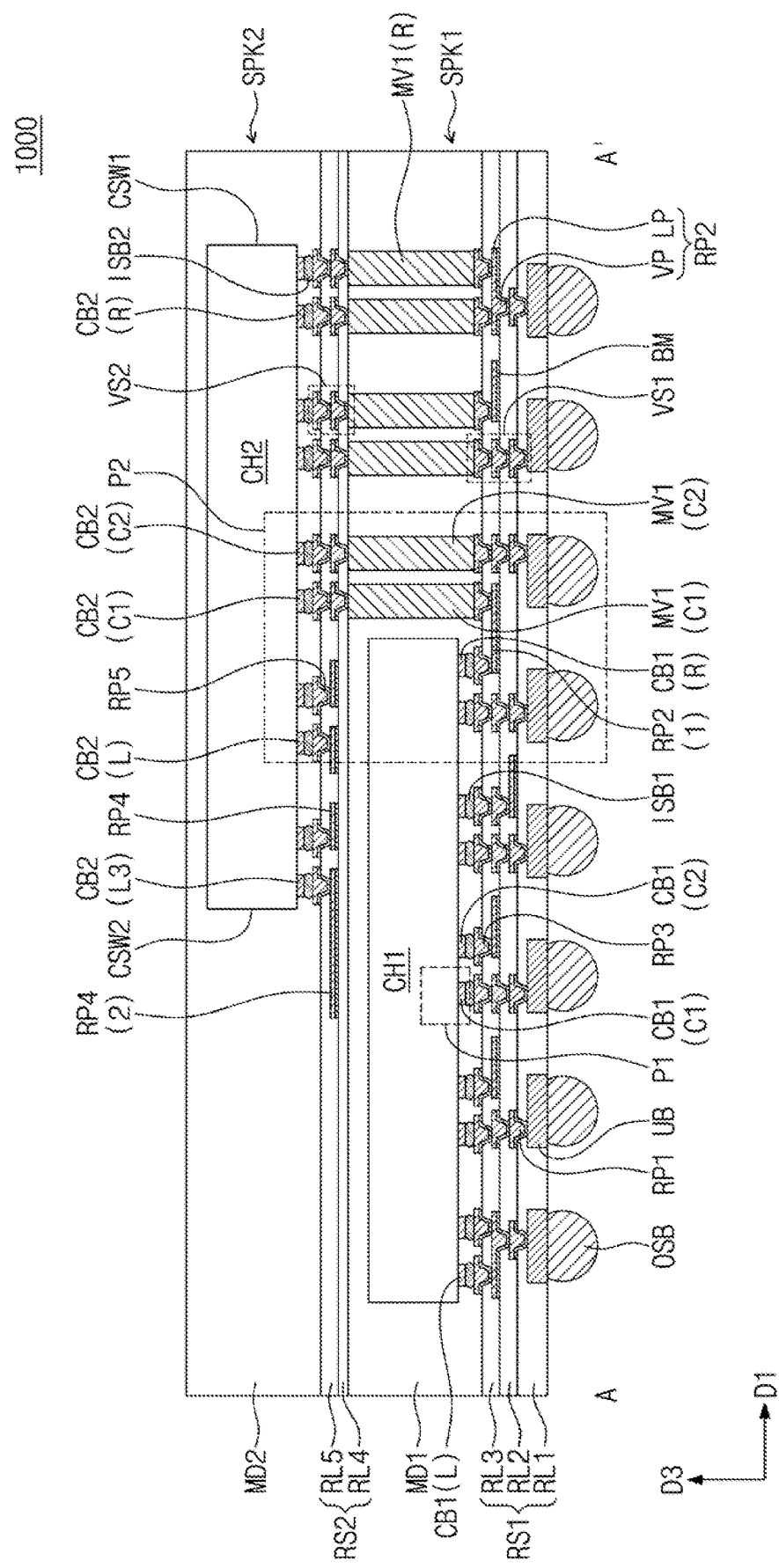
FIG. 2A is a cross-sectional view taken along line A-A' of FIG. 1.
Figure 2B:
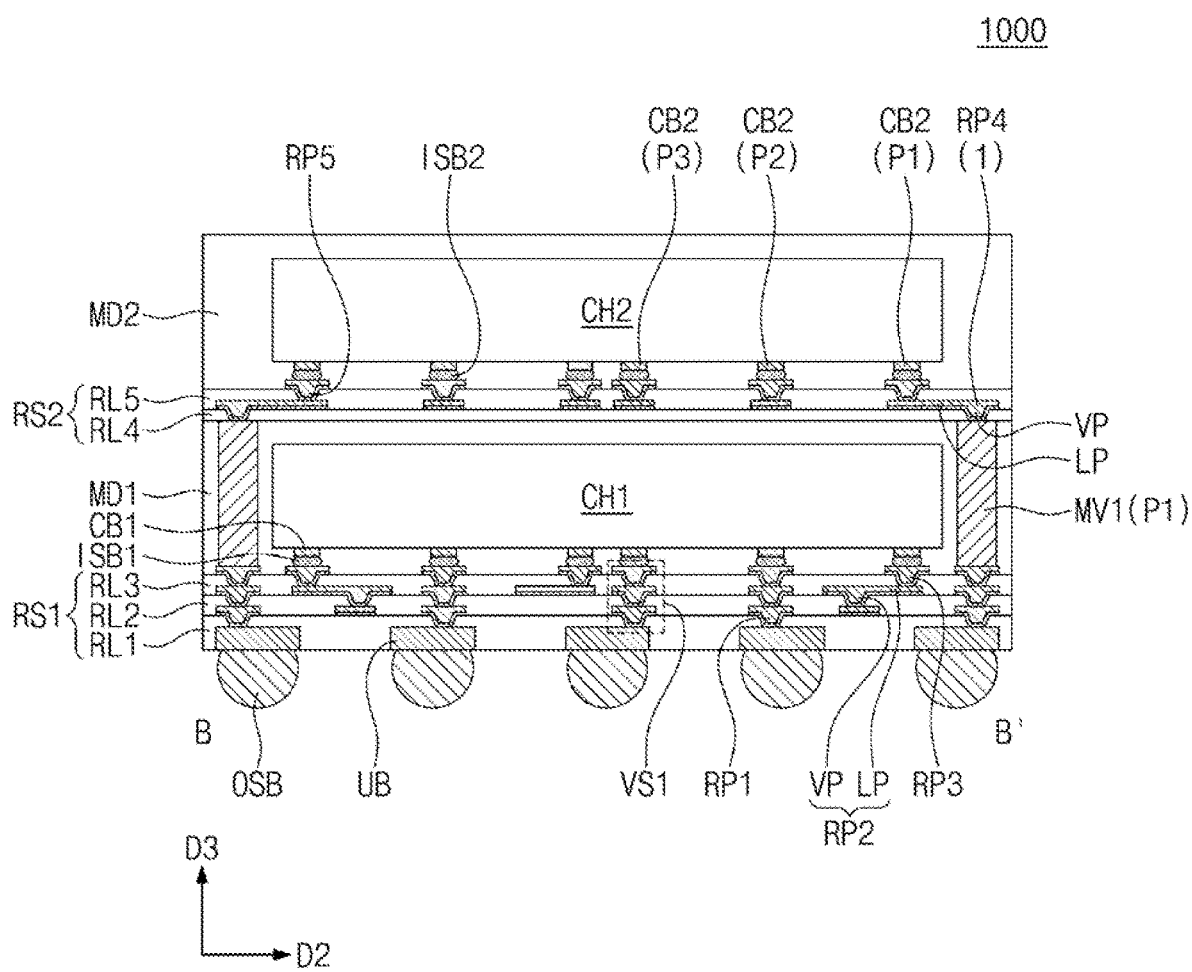
FIG. 2B is a cross-sectional view taken along line B-B' of FIG. 1.
Figure 3A:
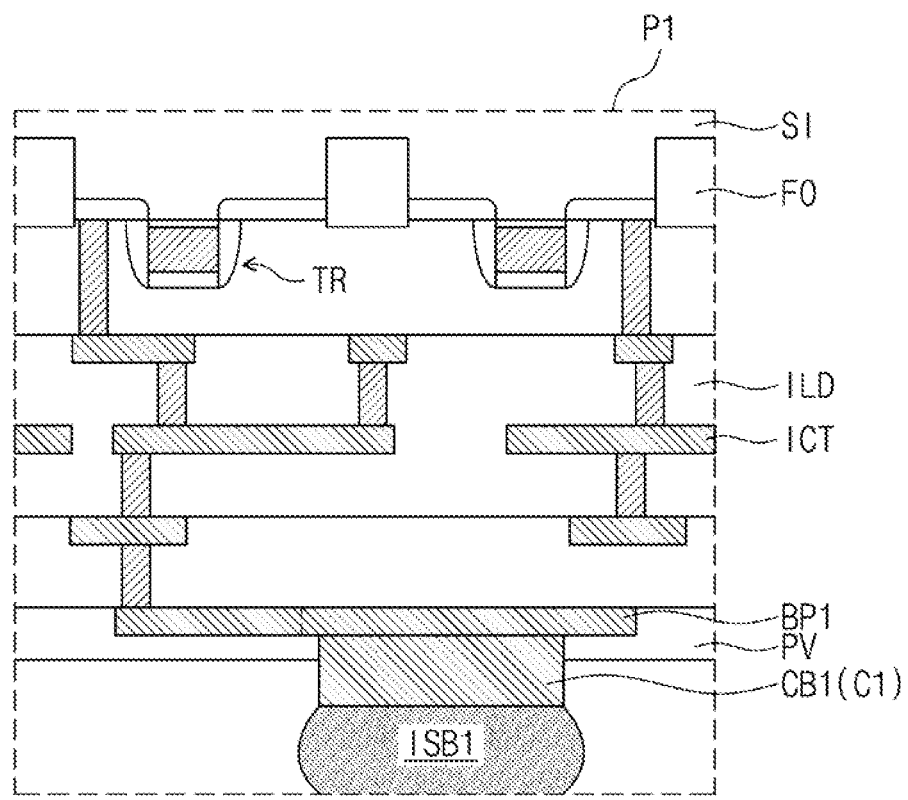
FIG. 3A is an enlarged view of section P1 of FIG. 2A.
Figure 3B:
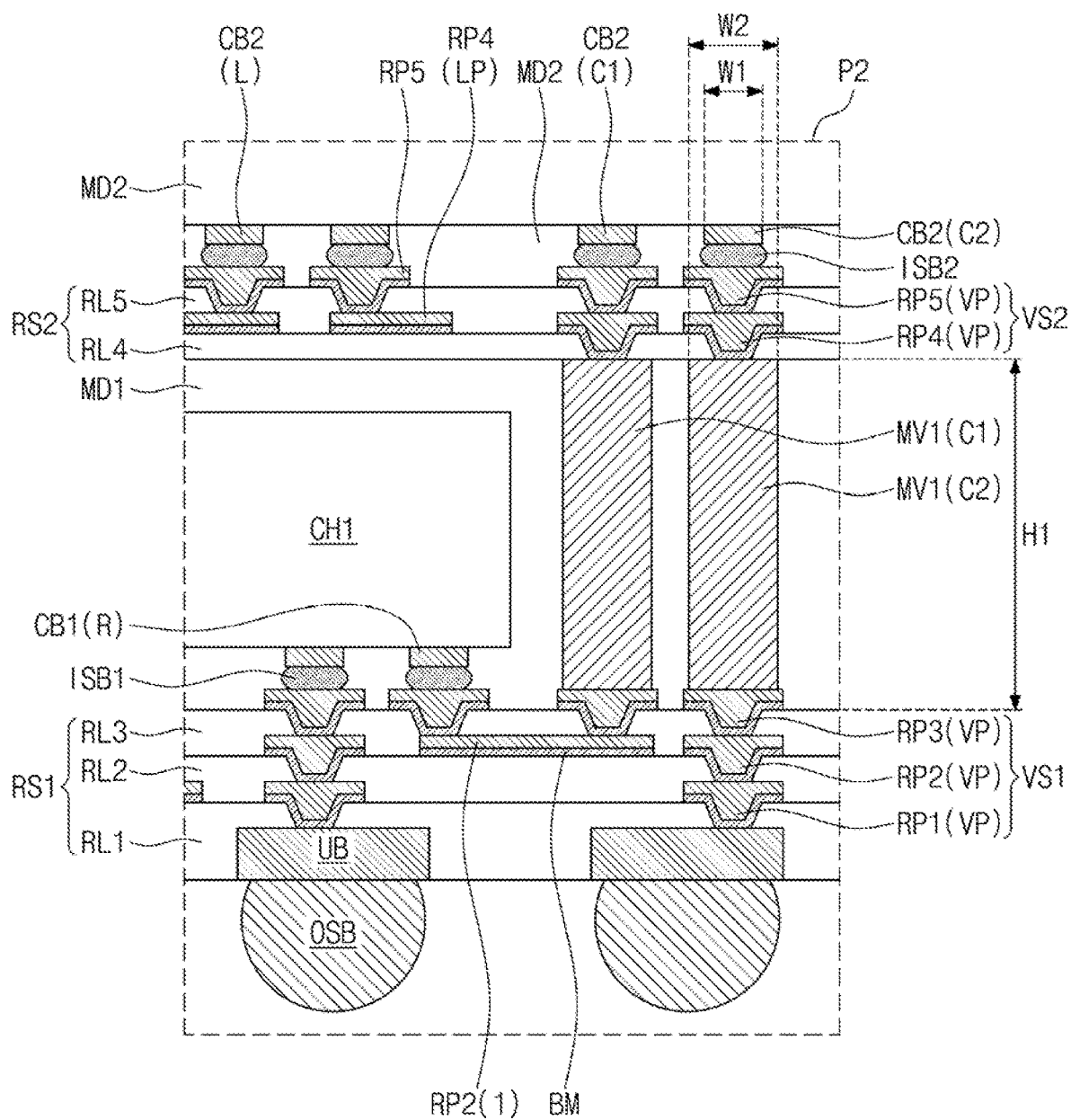
FIG. 3B is an enlarged view of section P2 of FIG. 2A.

FIG. 1 is a plan view of a semiconductor package according to some embodiments of the present inventive concepts. FIG. 2A is a cross-sectional view taken along line A-A' of FIG. 1. FIG. 2B is a cross-sectional view taken along line B-B' of FIG. 1. FIG. 3A is an enlarged view of section P1 of FIG. 2A. FIG. 3B is an enlarged view of section P2 of FIG. 2A.

Referring to FIGS. 1, 2A, and 2B, a semiconductor package 1000 according to the present embodiment includes a first redistribution substrate RS1, a first semiconductor chip CH1, a first mold layer MD1, a second redistribution substrate RS2, a second semiconductor chip CH2, and a second mold layer MD2 that are sequentially stacked. The first semiconductor chip CH1 is flip-chip mounted through first internal connection members ISB1 on the first redistribution substrate RS1. The first mold layer MD1 covers top and lateral surfaces of the first semiconductor chip CH1 and a top surface of the first redistribution substrate RS1. The first mold layer MD1 is interposed between the first semiconductor chip CH1 and the first redistribution substrate RS1.

In a present embodiment, the second semiconductor chip CH2 is flip-chip mounted through second internal connection members ISB2 on the second redistribution substrate RS2. The second mold layer MD2 covers top and lateral surfaces of the second semiconductor chip CH2 and a top surface of the second redistribution substrate RS2. The second mold layer MD2 is interposed between the second semiconductor chip CH2 and the second redistribution substrate RS2.

In a present embodiment, the semiconductor package 1000 further includes first-layer mold vias MV1 that penetrate the first mold layer MD1 and connect the second semiconductor chip CH2 to the first redistribution substrate RS1. Each of the first and second internal connection members ISB1 and ISB2 is a solder ball, and includes at least one of tin, lead, silver, aluminum, gold, or nickel. In a present embodiment, the first-layer mold vias MV1 are arranged asymmetrically in a first direction D1 about the first semiconductor chip CH1. For example, in a present embodiment, when viewed in the first direction D1, the first-layer mold vias MV1 are located on one side of the first semiconductor chip CH1.

In a present embodiment, a first sub-semiconductor package SPK1 includes the first redistribution substrate RS1, the first semiconductor chip CH1, the first mold layer MD1, and the first-layer mold vias MV1. A second sub-semiconductor package SPK2 includes the second redistribution substrate RS2, the second semiconductor chip CH2, and the second mold layer MD2. Each of the first and second sub-semiconductor packages SPK1 and SPK2 is shaped like a chip last type fan-out wafer level package (FOWLP).

In a present embodiment, the first redistribution substrate RS1 includes first, second, and third redistribution dielectric layers RL1, RL2, and RL3 that are sequentially stacked. The first redistribution dielectric layer RL1 is provided with under-bumps UB therein. Each of the under-bumps UB includes a metal, such as copper, aluminum, gold, or nickel. External connection terminals OSB are bonded to the under-bumps UB. Each of the external connection terminals OSB includes at least one of tin, lead, silver, aluminum, gold, or nickel.

In a present embodiment, the first and second redistribution dielectric layers RL1 and RL2 include first redistribution patterns RP1 therebetween. Each of the first redistribution patterns RP1 includes a via part VP that penetrates the first redistribution dielectric layer RL1 and connects to the under-bump UB. The second and third redistribution dielectric layers RL2 and RL3 are provided with second redistribution patterns RP2 therebetween. Each of the second redistribution patterns RP2 includes a via part VP that penetrates the second redistribution dielectric layer RL2 and connects to the first redistribution pattern RP1. In addition, each of the second redistribution patterns RP2 further includes a line part LP that extends in a direction from an upper portion of the via part VP and intervenes between the second and third redistribution dielectric layers RL2 and RL3. The via part VP and the line part LP are connected into a single piece. The via part VP is located below the line part LP. The via part VP has an inclined sidewall. A width of the via part VP decreases in a downward direction. The line part LP has a line shape and a pad shape when viewed in a plan view. The third redistribution dielectric layer RL3 is provided with third redistribution patterns RP3 thereon. Each of the third redistribution patterns RP3 includes a via part VP that penetrates the third redistribution dielectric layer RL3 and connects to the second redistribution pattern RP2.

In a present embodiment, each of the first and second mold layers MD1 and MD2 includes a dielectric resin, such as an epoxy molding compound (EMC). Each of the first and second mold layers MD1 and MD2 further includes fillers, and the fillers are dispersed in the dielectric resin.

In a present embodiment, the second redistribution substrate RS2 includes fourth and fifth redistribution dielectric layers RL4 and RL5 that are sequentially stacked. The fourth and fifth redistribution dielectric layers RL4 and RL5 are provided with fourth redistribution patterns RP4 therebetween. Each of the fourth redistribution patterns RP4 includes a via part VP that penetrates the fourth redistribution dielectric layer RL4 and connects to the first-layer mold via MV1. One or more of the fourth redistribution patterns RP4 further includes a line part LP that extends in a direction from an upper portion of the via part VP and intervenes between the fourth and fifth redistribution dielectric layers RL4 and RL5. The fifth redistribution dielectric layer RL5 is provided with fifth redistribution patterns RP5 thereon. Each of the fifth redistribution patterns RP5 includes a via part VP that penetrates the fifth redistribution dielectric layer RL5 and connects to the fourth redistribution pattern RP4.

In a present embodiment, a barrier/seed pattern BM is interposed between the first redistribution pattern RP1 and the first redistribution dielectric layer RL1, between the second redistribution pattern RP2 and the second redistribution dielectric layer RL2, between the third redistribution pattern RP3 and the third redistribution dielectric layer RL3, between the fourth redistribution pattern RP4 and the fourth redistribution dielectric layer RL4, and between the first redistribution pattern RP5 and the fifth redistribution dielectric layer RL5. The barrier/seed pattern BM includes a barrier layer and a seed layer that are sequentially stacked. The barrier layer includes at least one of titanium, titanium nitride, tantalum, tantalum nitride, or tungsten nitride. The seed layer includes the same metal as the first, second, third, fourth, and fifth redistribution patterns RP1, RP2, RP3, RP4, and RP5.

In addition, in a present embodiment, each of the first, third, and fifth redistribution patterns RP1, RP3, and RP5 further includes a line part LP. Each of the first, second, third, fourth, and fifth redistribution patterns RP1, RP2, RP3, RP4, and RP5 includes a metal, such as copper or gold. Each of the first, second, third, fourth, and fifth redistribution dielectric layers RL1, RL2, RL3, RL4, and RL5 includes a photo-imageable dielectric (PID) layer. Each of the first-layer mold vias MV1 includes a metal, such as copper or tin.

In a present embodiment, the first and second semiconductor chips CH1 and CH2 may be the same or different chips. For example, each of the first and second semiconductor chips CH1 and CH2 is one of an image sensor chip, such as a CMOS image sensor, a flash memory chip, such as a VNAND or NAND, a memory device chip, such as a DRAM, SRAM, EEPROM, PRAM, MRAM, ReRAM, HBM (high bandwidth memory), or HMC (hybrid memory cube), an application specific integrated circuit (ASIC) chip, a general purpose computing on graphic processing unit (GPGPU) chip, or a graphic double data rate (GDDR) chip. Alternatively, the first semiconductor chip CH1 may be a memory chip, and the second semiconductor chip CH2 may be a logic chip or a peripheral circuit chip that drives the first semiconductor chip CH1.

In a present embodiment, the first and second semiconductor chips CH1 and CH2 are memory chips of the same type. The first semiconductor chip CH1 includes first-chip conductive bumps CB1 bonded to a bottom surface thereof. The second semiconductor chip CH2 includes second-chip conductive bumps CB2 bonded to a bottom surface thereof. FIG. 1 depicts a planar arrangement of the second-chip conductive bumps CB2, but omits that of the first-chip conductive bumps CB1 for clarity of illustration. When viewed in a plan view, the arrangement of the first-chip conductive bumps CB1 is the same as that of the second-chip conductive bumps CB2.

Referring to FIG. 3A, in a present embodiment, the first semiconductor chip CH1 includes a plurality of transistors TR, chip wiring lines ICT, and second-chip bonding pads BP1 that are located on a semiconductor substrate SI. The semiconductor substrate SI may be either a silicon-on-insulator (SOI) substrate or a single-crystalline substrate of a semiconductor material such as silicon. The semiconductor substrate SI is provided therein with device isolation layers FO that defines active regions. The transistors TR are located on the active regions. The transistors TR include source/drain regions and a gate electrode. The transistors TR are covered with multi-layered chip dielectric layers ILD. Each of the chip dielectric layers ILD has a single-layered or a multi-layered structure that include at least one of a silicon oxide layer, a silicon nitride layer, a silicon oxynitride layer, or a porous dielectric layer. The chip wiring line ICT is interposed between the chip dielectric layers ILD and is electrically connected to the transistors TR. The second-chip bonding pads BP1 are connected to the chip wiring lines ICT and include a conductive material. The second-chip bonding pads BP1 are partially covered with a passivation layer PV. The passivation layer PV includes, for example, a silicon nitride layer. The first-chip conductive bumps CB1 are bonded to corresponding first-chip bonding pads BP1. The first-chip conductive bump CB1 vertically overlaps the transistor TR or the chip wiring line ICT. In addition, the first semiconductor chip CH1 further includes a memory pattern, such as a capacitor, a magnetic tunnel junction (MTJ) pattern, a phase change material pattern, a variable resistance pattern, or a charge storage pattern, each of which is connected to the transistor TR and/or the chip wiring line ICT. The transistor TR and the chip wiring lines ICT form various internal circuits. The second semiconductor chip CH2 has an internal structure the same as or similar to that of the first semiconductor chip CH1 discussed with reference to FIG. 3A.

In a present embodiment, the first internal connection members ISB1 are bonded to the first-chip conductive bumps CB1. However, embodiments are not limited thereto, and in other embodiments, the first-chip conductive bumps CB1 are omitted, and the first internal connection members ISB1 are directly bonded to the second-chip bonding pads BP1. The second internal connection members ISB2 are bonded to second-chip conductive bumps CB2. However, embodiments are not limited thereto, and in other embodiments, the second-chip conductive bumps CB2 are omitted, and the second internal connection members ISB2 are directly bonded to second-chip bonding pads of the second semiconductor chip CH2.

Referring to FIGS. 2A and 3B, in a present embodiment, each of the second-chip conductive bumps CB2 has a first width W1. Each of the first-layer mold vias MV1 has a second width W2 the same as or greater than the first width W1. Each of the first-layer mold vias MV1 has a cylindrical shape and the second width W2 is constant over its height. Each of the first-layer mold vias MV1 has a first height H1. The first height H1 ranges, for example, from about 150 μm to about 190 μm.

Referring to FIG. 3B, in a present embodiment, the first redistribution substrate RS1 has first via structures VS1 located therein. The first via structures VS1 has a structure in which the via parts VP of the first, second, and third redistribution patterns RP1, RP2, and RP3 are vertically aligned with each other. The second redistribution substrate RS2 has second via structures VS2 located therein. The second via structures VS2 have a structure in which the via parts VP of the fourth and fifth redistribution patterns RP4 and RP5 are vertically aligned with each other.

In a present embodiment, neither the first semiconductor chip CH1 nor the second semiconductor chip CH2 includes a through silicon via (TSV) that penetrates the semiconductor substrate SI included therein.

As shown in FIG. 1, in a present embodiment, each of the first and second semiconductor chips CH1 and CH2 has a chip width WT in the first direction D1. The first and second semiconductor chips CH1 and CH2 are offset from each other in the first direction D1. When viewed in a plan view, a portion of the second semiconductor chip CH2 overlaps a portion of the first semiconductor chip CH1. The second semiconductor chip CH2 has an overlap width WO at the portion that overlaps the portion of the first semiconductor chip CH1. The overlap width WO ranges from about 10% to about 90% of the chip width WT. In a present embodiment, the overlap width WO ranges from about 30% to about 45% of the chip width WT. The second semiconductor chip CH2 has a first chip sidewall CSW1 and a second chip sidewall CSW2 that are opposite to each other. The first chip sidewall CSW1 does not overlap the first semiconductor chip CH1. The second chip sidewall CSW2 overlaps the first semiconductor chip CH1.

In a present embodiment, the second-chip conductive bumps CB2 include second-chip central conductive bumps CB2(C1) and CB2(C2), second-chip right conductive bumps CB2(R), and second-chip left conductive bumps CB2(L). The second-chip central conductive bumps CB2(C1) and CB2(C2) are arranged in two columns along the second direction D2 on a central portion of the second semiconductor chip CH2. As shown in FIG. 1, the second-chip right conductive bumps CB2(R) are located on a right side of the second-chip central conductive bumps CB2(C1) and CB2(C2), and the second-chip left conductive bumps CB2(L) are located on a left side of the second-chip central conductive bumps CB2(C1) and CB2(C2). The second-chip central conductive bumps CB2(C1) and CB2(C2) are signal pins, such as data pins and/or command/access pins. At least one of the second-chip right and left conductive bumps CB2(R) and CB2(L) is a power pin to which a power voltage is applied or a ground pin to which a ground voltage is applied. In a present embodiment, neither the second-chip central conductive bumps CB2(C1) and CB2(C2) nor the second-chip right conductive bumps CB2(R) overlaps the first semiconductor chip CH1, while the second-chip left conductive bumps CB2(L) do overlap the first semiconductor chip CH1.

In a present embodiment, one or more of the second-chip central and right conductive bumps CB2(C1), CB2(C2), and CB(R) is vertically aligned with the first-layer mold vias MV1. The second-chip left conductive bumps CB2(L) are not vertically aligned with the first-layer mold vias MV1. The first-layer mold vias MV1 include first-layer central mold vias MV1(C1) and MV1(C2) that overlap corresponding second-chip central conductive bumps CB2(C1) and CB2(C2), first-layer right mold vias MV1(R) that overlap corresponding second-chip right conductive bumps CB(R), and first-layer peripheral mold vias MV1(P1) and MV1(P2). When viewed in a plan view, the first-layer peripheral mold vias MV1(P1) and MV1(P2) do not overlap any of the first and second semiconductor chips CH1 and CH2, and are located outside of the first and second semiconductor chips CH1 and CH2.

In a present embodiment, an arrangement of the first-chip conductive bumps CB1 is the same as or similar to that of the second-chip conductive bumps CB2. For example, the first-chip conductive bumps CB1 include first-chip central conductive bumps CB1(C1) and CB1(C2), first-chip right conductive bumps CB1(R), and first-chip left conductive bumps CB1(L).

Referring to FIGS. 2A and 3B, in a present embodiment, a second-chip first central conductive bump CB2(C1) of the second-chip central conductive bumps CB2(C1) and CB2(C2) is connected to one of the first-chip right conductive bumps CB1(R) through one of the second via structures VS2 in the second redistribution substrate RS2, a first-layer first central mold via MV1(C1), one of the third redistribution patterns RP3, and one RP2(1) of the second redistribution patterns RP2. Therefore, the second semiconductor chip CH2 is electrically connected to the first semiconductor chip CH1. The second-chip first central conductive bump CB2(C1) is vertically aligned with one of the second via structures VS2 and the first-layer first central mold via MV1(C1). Accordingly, a signal delivery speed increases due to a length reduction of a connection path that connects the second semiconductor chip CH2 to the first semiconductor chip CH1.

Referring to FIGS. 2A and 3B, in a present embodiment, at least one of the second-chip central conductive bumps CB2(C1) and CB2(C2) is connected to at least one of the external connection terminals OSB. In detail, a second-chip second central conductive bump CB2(C2) of the second-chip central conductive bumps CB2(C1) and CB2(C2) is connected to one of the external connection terminals OSB through one of the second via structures VS2 in the second redistribution substrate RS2, a first-layer second central mold via MV1(C2), one of the first via structures VS1, and one of the under-bumps UB. Therefore, the second semiconductor chip CH2 transceives signals with an external device. The second-chip second central conductive bump CB2(C2) is vertically aligned with one of the second via structures VS2 in the second redistribution substrate RS2, the first-layer second central mold via MV1(C2), one of the first via structures VS1, and one of the under-bumps UB. Accordingly, a signal delivery speed increases due to a length reduction of a connection path that connects the second semiconductor chip CH2 to the external connection terminal OSB.

Identical or similar to that discussed above, referring to FIG. 2A, in a present embodiment, at least one of the second-chip right conductive bumps CB2(R) is connected to at least one of the external connection terminals OSB. In detail, at least one of the second-chip right conductive bumps CB2(R) is connected to and vertically aligned with one of the second via structures VS2 in the second redistribution substrate RS2, one of the first-layer right mold vias MV1(R), one of the first via structures VS1, and one of the under-bumps UB.

Referring to FIG. 2A, in a present embodiment, at least one pair of neighboring second-chip right conductive bumps CB2(R) are connected to each other through the line part LP of one of the second redistribution patterns RP2 and thus are provided with the same signal. One external connection terminal OSB is shared by the at least one pair of neighboring second-chip right conductive bumps CB2(R).

Referring to FIGS. 1 and 2B, in a present embodiment, the second-chip left conductive bumps CB2(L) include a second-chip first left conductive bump CB2(L1), a second-chip second left conductive bump CB2(L2) and a second-chip third left conductive bump CB2(L3). The second-chip first left conductive bump CB2(L1) is electrically connected to a first-layer first peripheral mold via MV1(P1) through the line part LP of one RP4(1) of the fourth redistribution patterns RP4. The second-chip second left conductive bump CB2(L2) and the second-chip third left conductive bump CB2(L3) are both electrically connected to a first-layer second peripheral mold via MV1(P2) through the line part LP of another RP4(2) fourth redistribution patterns RP4. The another RP4(2) fourth redistribution patterns RP4 has an "F" shape when viewed in a plan view.

A semiconductor package should have increased performance and capacity. The increased number of internal circuits improves the performance and capacity of a semiconductor chip, but there is also an increase in size of the semiconductor chip. The size increase of the semiconductor chip causes a reduction in wafer yield. The performance and capacity of a semiconductor package increases in a structure in which small-sized semiconductor chips are manufactured and stacked. In such a structure, one or more through vias are used to connect the small-sized semiconductor chips to each other.

However, a semiconductor chip that includes a through via is larger than a semiconductor chip that does not include a through via. Internal circuits might not fit in a TSV region where the through vias are located, and thus the size of the semiconductor chip increases by the size of the TSV region. In addition, additional chip wiring lines are formed to connect the through vias to the internal circuits, and therefore the production costs of the semiconductor chip increases. In particular, the chip wiring lines have fine line-widths in a highly integrated semiconductor chip which require a high-cost extreme ultraviolet (EUV) photolithography process, which increases the production costs. In an embodiment of the present inventive concepts, the first and second semiconductor chips CH1 and CH2 do not include through vias, and thus have decreased size and production costs, compared to a semiconductor chip that includes a through via.

In addition, conductive bumps overlap each other in a structure that includes stacked semiconductor chips and through vias. Thus, redistribution patterns have line parts that are relatively long to divide signals, which increases signal delivery distance and decreases operating speed. In contrast, in an embodiment of the present inventive concepts, no through via (TSV) are used. Instead, the first-layer mold via MV1 is used to connect the second semiconductor chip CH2 to one or more of the first semiconductor chip CH1 and the first redistribution substrate RS1. In an embodiment of the present inventive concepts, ones of the first-layer mold vias MV1 is vertically aligned with or adjacent to the second conductive bumps CB2, and accordingly a signal delivery distance is reduced to increase an operating speed. Moreover, in an embodiment of the present inventive concepts, the first-layer mold via MV1 and redistribution patterns increase the degree of freedom of wiring.

Figure 4:
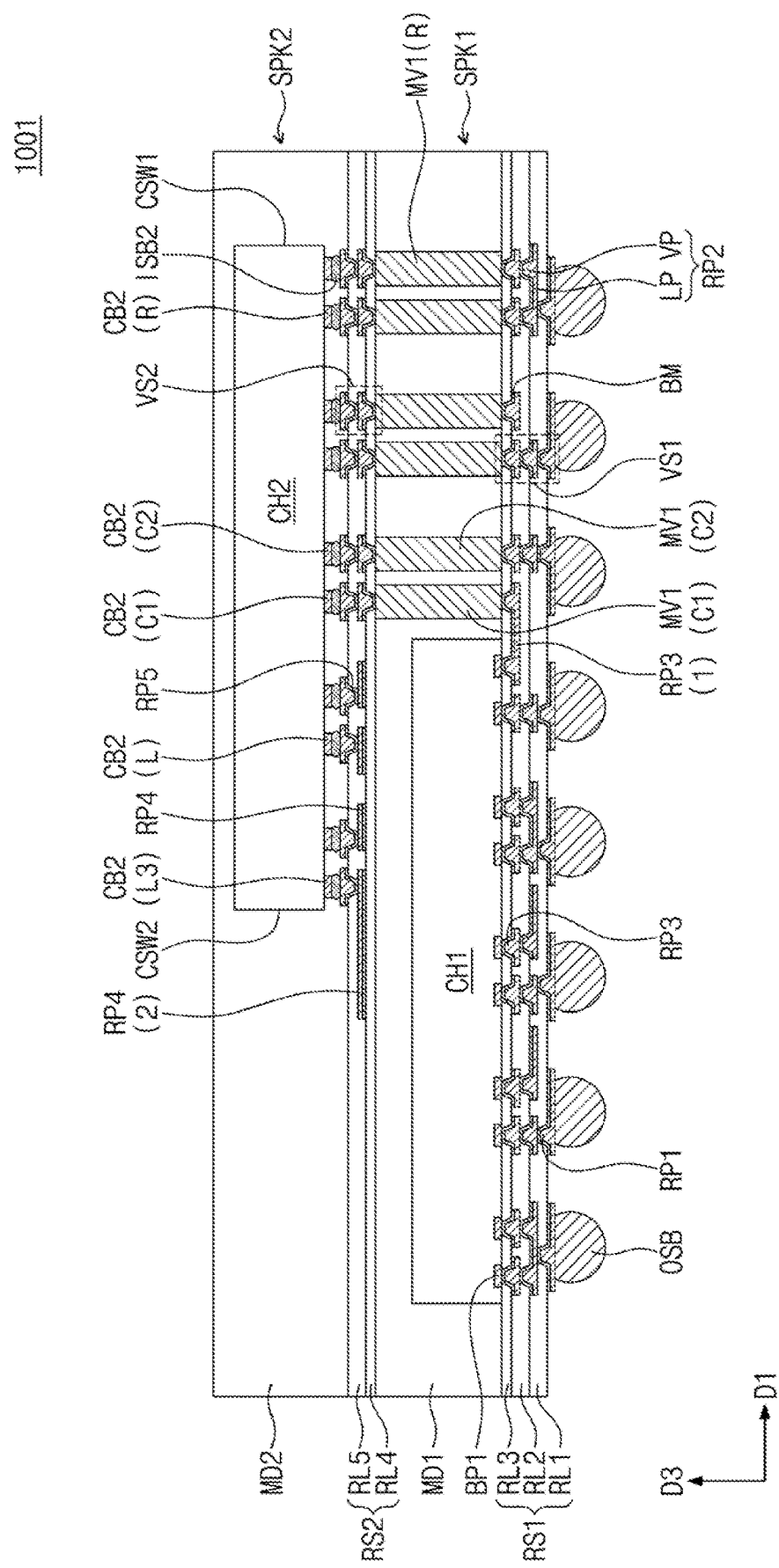
FIG. 4 is a cross-sectional view of a semiconductor package according to some embodiments of the present inventive concepts.

FIG. 4 is a cross-sectional view of a semiconductor package according to some embodiments of the present inventive concepts.

Referring to FIG. 4, a semiconductor package 1001 according to a present embodiment includes a first sub-semiconductor package SPK1 and a second sub-semiconductor package SPK2 that are sequentially stacked. The second sub-semiconductor package SPK2 is the same as or similar to that described with reference to FIGS. 1 to 3B. The first sub-semiconductor package SPK1 is shaped like a chip first type fan-out wafer level package (FOWLP). The first sub-semiconductor package SPK1 includes a first redistribution substrate RS1, a first semiconductor chip CH1 mounted on the first redistribution substrate RS1, and a first mold layer MD1 that covers the first semiconductor chip CH1. The first semiconductor chip CH1 is in direct contact with the first redistribution substrate RS1. The first sub-semiconductor package SPK1 excludes the first internal connection member ISB1 of FIG. 2A. The first semiconductor chip CH1 excludes the first-chip conductive bumps CB1 of FIG. 2A. Each of the first, second, and third redistribution patterns RP1, RP2, and RP3 in the first redistribution substrate RS1 includes a via part VP and a line part LP that are integrally connected into a single piece. The via part VP is located on the line part LP. A barrier/seed layer BM is interposed between the first redistribution pattern RP1 and the first redistribution dielectric layer RL1, between the second redistribution pattern RP2 and the second redistribution dielectric layer RL2, and between the third redistribution pattern RP3 and the third redistribution dielectric layer RL3. The via part VP of the third redistribution pattern RP3 is in contact with or adjacent to the first-chip bonding pad BP1 of the first semiconductor chip CH1. An external connection terminal OSB is in contact with the line part LP of the first redistribution pattern RP1. The second semiconductor chip CH2 is electrically connected to the first semiconductor chip CH1 through one RP3(1) of the third redistribution patterns RP3. Other configurations are identical or similar to those described with reference to FIGS. 1 to 3B.

Figure 5:
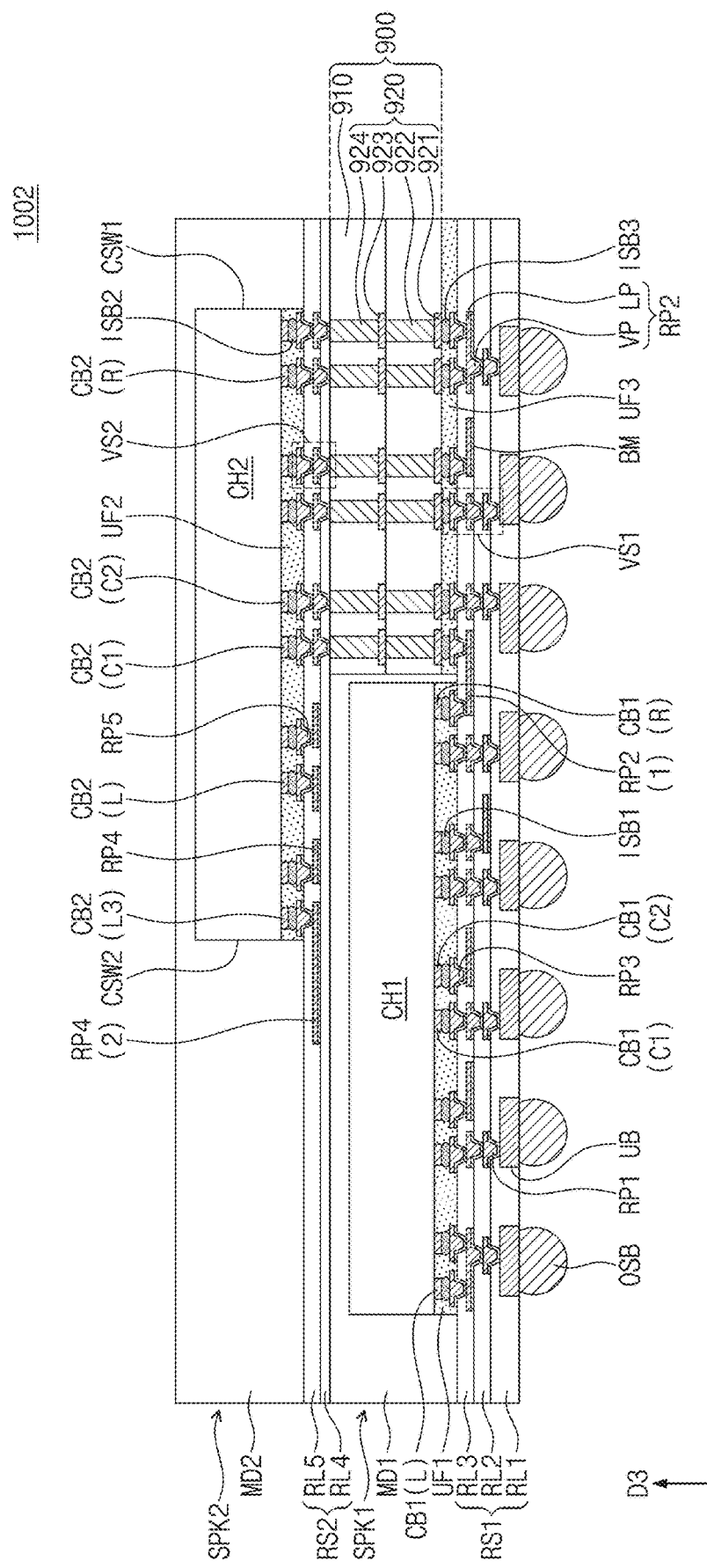
FIG. 5 is a cross-sectional view of a semiconductor package according to some embodiments of the present inventive concepts.

FIG. 5 is a cross-sectional view of a semiconductor package according to some embodiments of the present inventive concepts.

Referring to FIG. 5, a semiconductor package 1002 according to a present embodiment includes a first sub-semiconductor package SPK1 and a second sub-semiconductor package SPK2 that are sequentially stacked. The second sub-semiconductor package SPK2 is the same as or similar to that described with reference to FIGS. 1 to 3B. The first sub-semiconductor package SPK1 is shaped like a chip last type fan-out panel level package (FOPLP). The first sub-semiconductor package SPK1 includes a first redistribution substrate RS1, a connection substrate 900 mounted on the first redistribution substrate RS1, and a first semiconductor chip CH1 mounted on the first redistribution substrate RS1.

In a present embodiment, the connection substrate 900 is located at one side of the first semiconductor chip CH1. The connection substrate 900 includes a plurality of base layers 910 and a plurality of conductive structures 920. The base layers 910 include a dielectric material. For example, the base layers 910 include one or more of a carbon-based material, a ceramic, or a polymer. The conductive structure 920 includes a connection pad 921, a first connection via 922, a connection line 923, and a second connection via 924. The connection line 923 has a pad or linear shape. When viewed in a plan view, an arrangement of the conductive structures 920 is the same as or similar to that of the first-layer mold vias MV1 depicted in FIG. 1. One or more of the second-chip conductive bumps CB2 are vertically aligned with the conductive structures 920. The connection substrate 900 is connected through a third internal connection member ISB3 to the first redistribution substrate RS1.

In a present embodiment, a first under-fill layer UF1 is interposed between the first semiconductor chip CH1 and the first redistribution substrate RS1. A second under-fill layer UF2 is interposed between the second semiconductor chip CH2 and the second redistribution substrate RS2. A third under-fill layer UF3 is interposed between the connection substrate 900 and the first redistribution substrate RS1. Each of the first, second, and third under-fill layers UF1, UF2, and UF3 includes a thermo-curable resin or a photo-curable resin. Each of the first, second, and third under-fill layers UF1, UF2, and UF3 further includes organic or inorganic fillers dispersed in the thermo-curable or photo-curable resin layer. Other configurations are identical or similar to those described with reference to FIGS. 1 to 3B.

Figure 6:
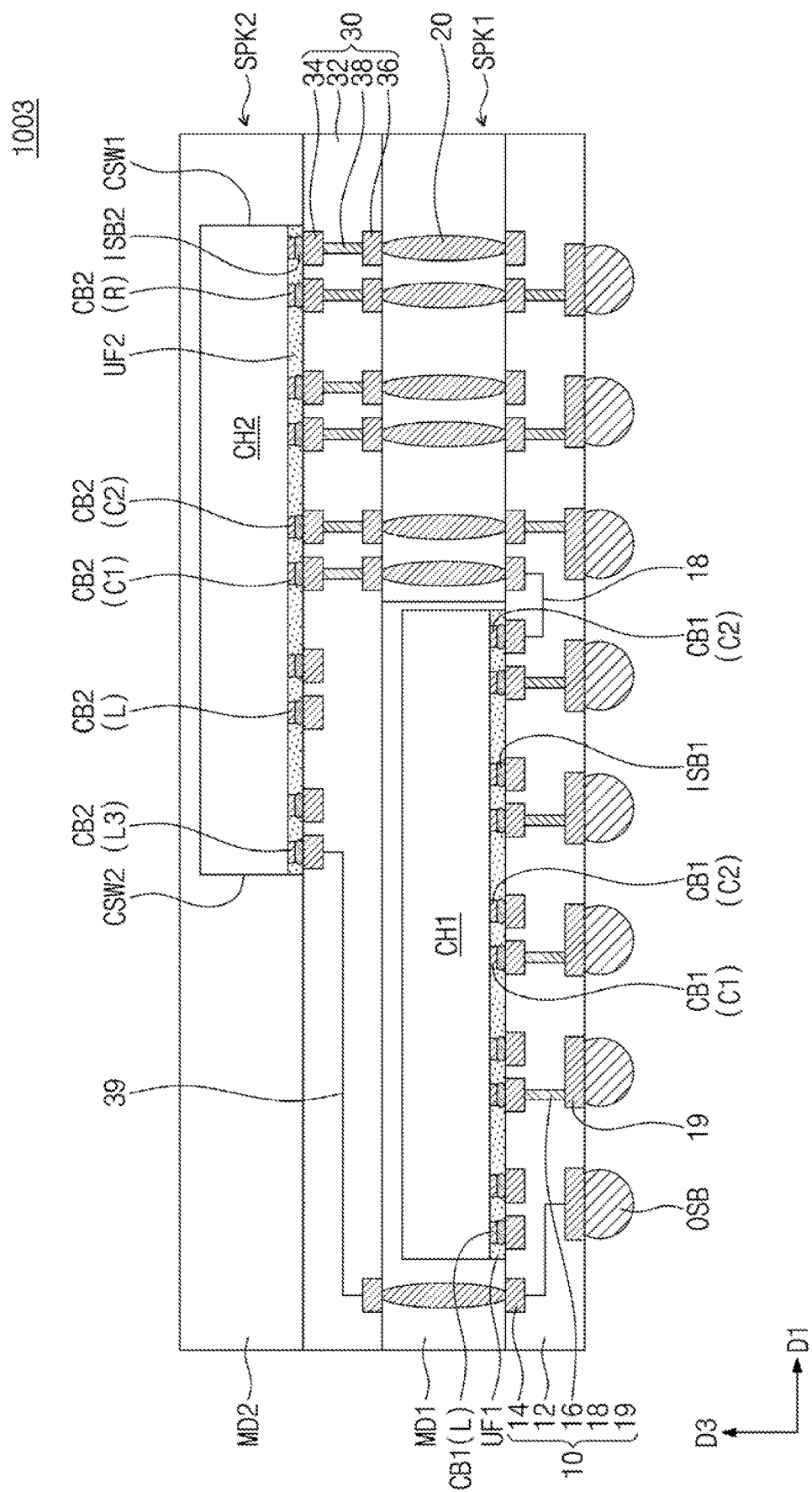
FIG. 6 is a cross-sectional view of a semiconductor package according to some embodiments of the present inventive concepts.

FIG. 6 is a cross-sectional view of a semiconductor package according to some embodiments of the present inventive concepts.

Referring to FIG. 6, a semiconductor package 1003 according to a present embodiment includes a first sub-semiconductor package SPK1 and a second sub-semiconductor package SPK2 that are sequentially stacked. The semiconductor package 1003 is shaped like a package-on-package. The first sub-semiconductor package SPK1 includes a first package substrate 10, a first semiconductor chip CH1 mounted on the first package substrate 10, and a first mold layer MD1 that covers the first semiconductor chip CH1. The second sub-semiconductor package SPK2 includes a second package substrate 30, a second semiconductor chip CH2 mounted on the second package substrate 30, and a second mold layer MD2 that covers the second semiconductor chip CH2.

In a present embodiment, each of the first and second package substrates 10 and 30 is a bi-layered or multi-layered printed circuit board. The first package substrate 10 includes a first dielectric body layer 12, first substrate upper pads 14 and first substrate lower pads 19 respectively located on a top surface and a bottom surface of the first dielectric body layer 12, first substrate vias 16 that penetrate the first dielectric body layer 12 and connect the first substrate upper pads 14 to the first substrate lower pads 19, and first substrate internal lines 18. The second package substrate 30 includes a second dielectric body layer 32, second substrate upper pads 34 and second substrate lower pads 36 respectively located on a top surface and a bottom surface of the second dielectric body layer 32, second substrate vias 38 that penetrate the second dielectric body layer 32 and connect the second substrate upper pads 34 to the second substrate lower pads 36, and second substrate internal lines 39. Each of the first and second dielectric body layers 12 and 32 includes a thermosetting resin such as an epoxy resin, a thermoplastic resin such as polyimide, or a resin in which a thermosetting or thermoplastic resin is impregnated with a reinforcement such as glass fiber and/or inorganic filler, where the impregnated resin includes a one of a prepreg, a fire resist-4 (FR4), or a photosensitive resin, but embodiments of the present inventive concepts are not limited thereto.

In a present embodiment, each of the first substrate upper pads 14, the first substrate lower pads 19, the first substrate vias 16, the first substrate internal lines 18, the second substrate upper pads 34, the second substrate lower pads 36, the second substrate vias 38, and the second substrate internal lines 39 includes a metal, such as copper, gold, aluminum, or nickel.

In a present embodiment, package connection members 20 penetrate the first mold layer MD1 and connect the first package substrate 10 to the second package substrate 30. Each of the package connection members 20 includes at least one of tin, silver, or nickel. Solder balls are merged to form the package connection members 20. Each of the package connection members 20 has a convex central portion. When viewed in a plan view, an arrangement of the package connection members 20 is the same as or similar to that of the first-layer mold vias MV1 depicted in FIG. 1.

In a present embodiment, the first substrate internal line 18 connects the second semiconductor chip CH2 to the first semiconductor chip CH1. Some of the second-chip conductive bumps CB2 in the second semiconductor chip CH2 are vertically aligned with the second substrate vias 38, the package connection members 20, and the first substrate vias 16. Therefore, a delivery distance is reduced and an operating speed is increased. Other configurations are identical or similar to those described with reference to FIGS. 1 to 5.

Figure 7:
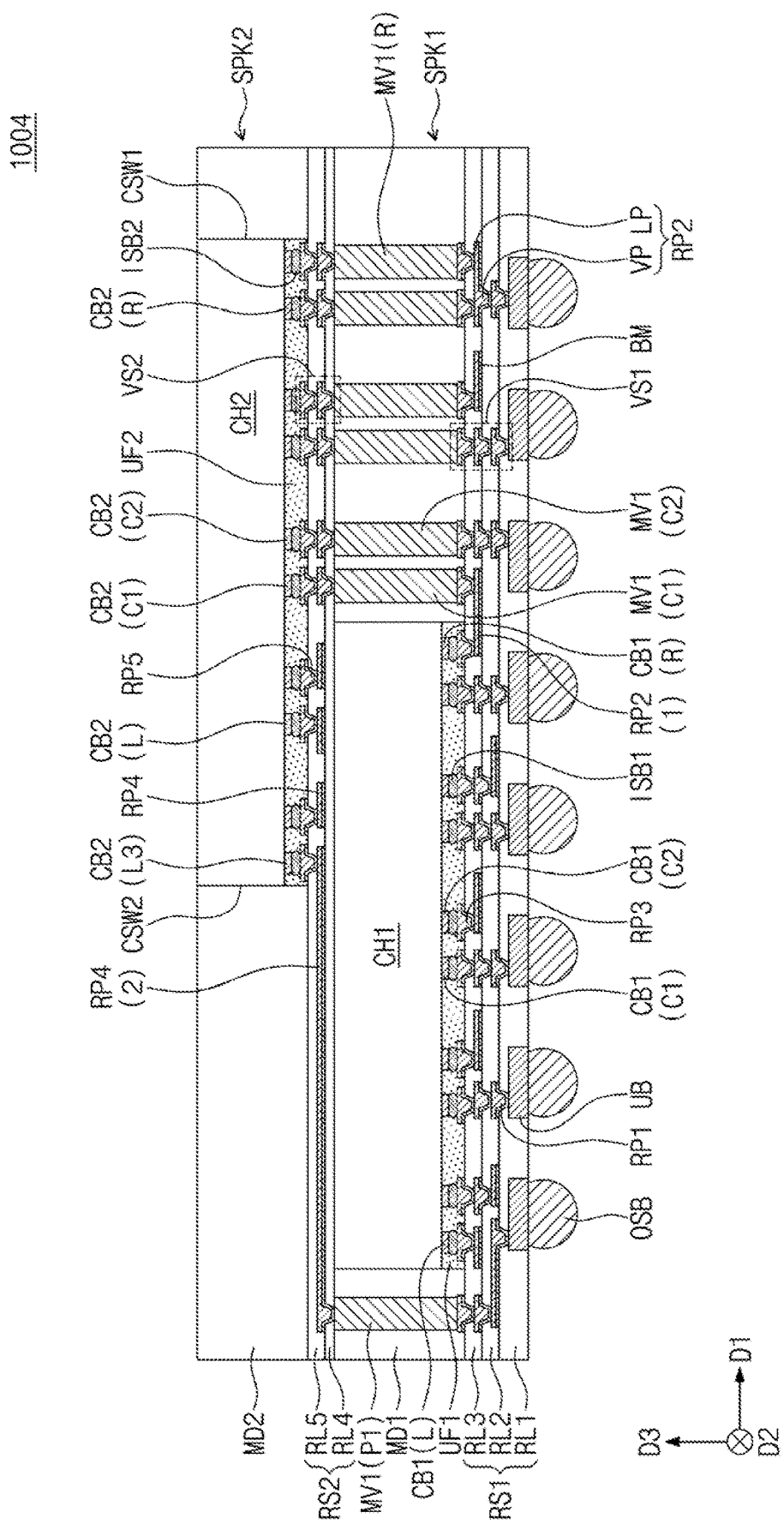
FIG. 7 is a cross-sectional view of a semiconductor package according to some embodiments of the present inventive concepts.

FIG. 7 is a cross-sectional view of a semiconductor package according to some embodiments of the present inventive concepts.

Referring to FIG. 7, a semiconductor package 1004 according to a present embodiment is configured such that the first semiconductor chip CH1 is in contact with a bottom surface of the second redistribution substrate RS2. The first mold layer MD1 has a top surface that is coplanar with that of the first semiconductor chip CH1. The second mold layer MD2 has a top surface coplanar with that of the second semiconductor chip CH2. A first under-fill layer UF1 is interposed between the first semiconductor chip CH1 and the first redistribution substrate RS1. A second under-fill layer UF2 is interposed between the second semiconductor chip CH2 and the second redistribution substrate RS2.

In a present embodiment, when viewed in a second direction D2, the first-layer mold vias MV1 are arranged asymmetrically about the first semiconductor chip CH1. In a present embodiment, when viewed in the second direction D2, the number of the first-layer mold vias MV1 is greater on one side of the first semiconductor chip CH1 than on another side of the first semiconductor chip CH1. As shown in FIG. 7, six first-layer mold vias MV1 are located on a right side of the first semiconductor chip CH1, and one first-layer mold via MV1 is located on a left side of the first semiconductor chip CH1. The first-layer mold via MV1 located on the left side of the first semiconductor chip CH1 is called a first-layer peripheral mold via MV1(P1), and does not overlap any of the first and second semiconductor chips CH1 and CH2. Other configurations may be identical or similar to those described with reference to FIGS. 1 to 6.

Figure 8:
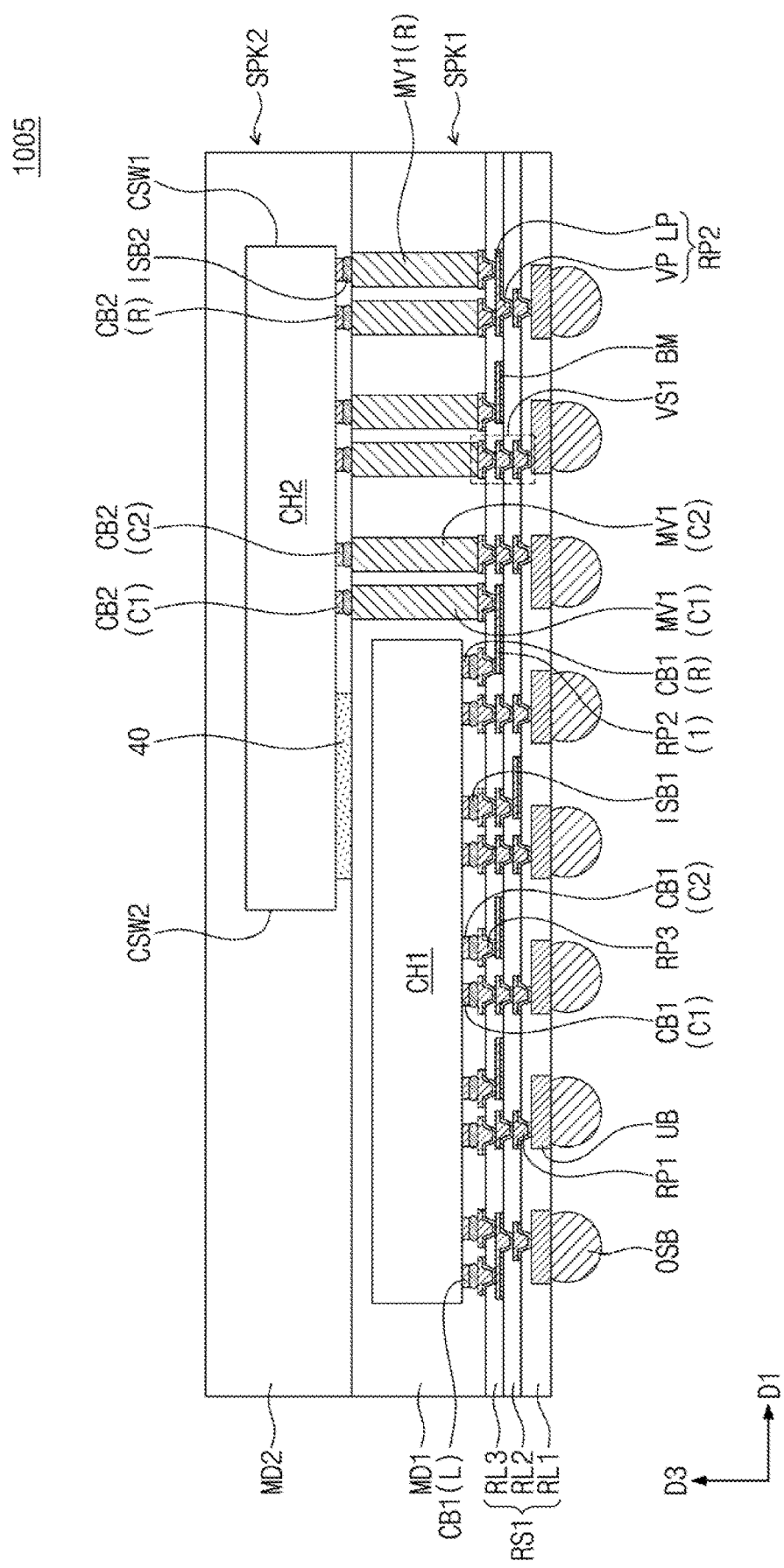
FIG. 8 is a cross-sectional view of a semiconductor package according to some embodiments of the present inventive concepts.

FIG. 8 is a cross-sectional view of a semiconductor package according to some embodiments of the present inventive concepts.

Referring to FIG. 8, a semiconductor package 1005 according to a present embodiment includes a first sub-semiconductor package SPK1 and a second sub-semiconductor package SPK2 that are sequentially stacked. The first sub-semiconductor package SPK1 is the same as or similar to that of FIG. 2A. The second sub-semiconductor package SPK2 excludes the second redistribution substrate RS2 of FIG. 2A. The second internal connection member ISB2 directly connects the second semiconductor chip CH2 to the first-layer mold vias MV1. The second mold layer MD2 is in contact with a top surface of the first mold layer MD1. That is, a bottom surface of the second mold layer MD2 is in contact with a top surface of the first mold layer MD1. A support pattern 40 is interposed between the bottom surface of the second semiconductor chip CH2 and a top surface of the first mold layer MD1 on the first semiconductor chip CH1. The support pattern 40 includes a dielectric material or a thermal interface material (TIM). Other configurations are identical or similar to those described with reference to FIGS. 1 to 6.

Figure 9:
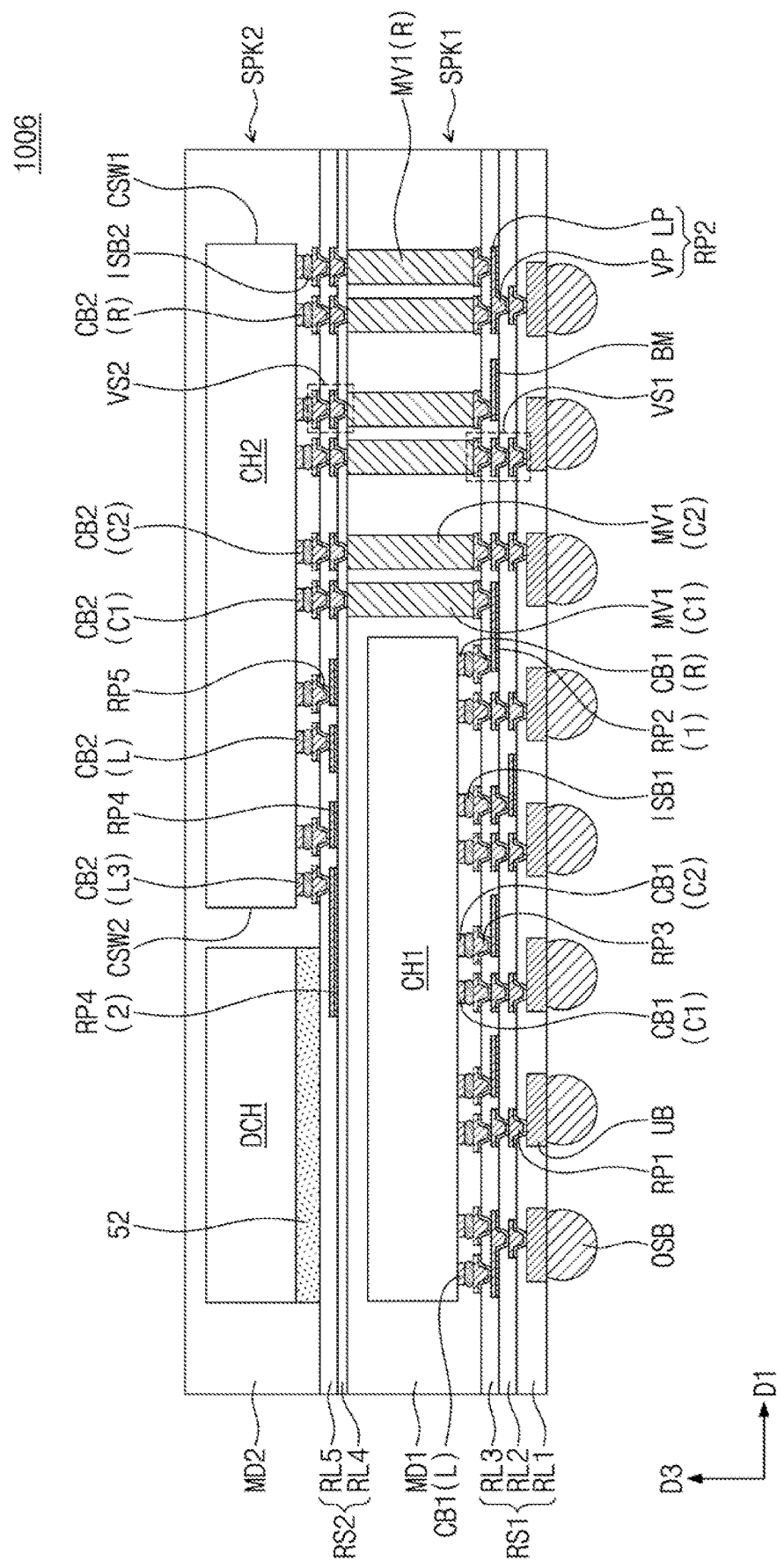
FIG. 9 is a cross-sectional view of a semiconductor package according to some embodiments of the present inventive concepts.

FIG. 9 is a cross-sectional view of a semiconductor package according to some embodiments of the present inventive concepts.

Referring to FIG. 9, a semiconductor package 1006 according to a present embodiment includes a first sub-semiconductor package SPK1 and a second sub-semiconductor package SPK2 that are sequentially stacked. The first sub-semiconductor package SPK1 is the same as or similar to that of FIG. 2A. The second sub-semiconductor package SPK2 further includes a dummy semiconductor chip DCH located adjacent to, but spaced apart from, the second chip sidewall CSW2 of the second semiconductor chip CH2, and an adhesive layer 52. The adhesive layer 52 is interposed between the dummy semiconductor chip DCH and the second redistribution substrate RS2. The dummy semiconductor chip DCH does not have an electrical circuit. The dummy semiconductor chip DCH includes silicon and has the same or similar physical or thermal characteristics as the first and second semiconductor chips CH1 and CH2, and accordingly it can help suppress or relax warpage of the semiconductor package 1006. For example, the dummy semiconductor chip DCH has the same thermal expansion coefficient as the first and second semiconductor chips CH1 and CH2. The dummy semiconductor chip DCH is not electrically connected to the second redistribution substrate RS2. Other structural features are identical or similar to that described with reference to FIG. 2A.

Figure 10:
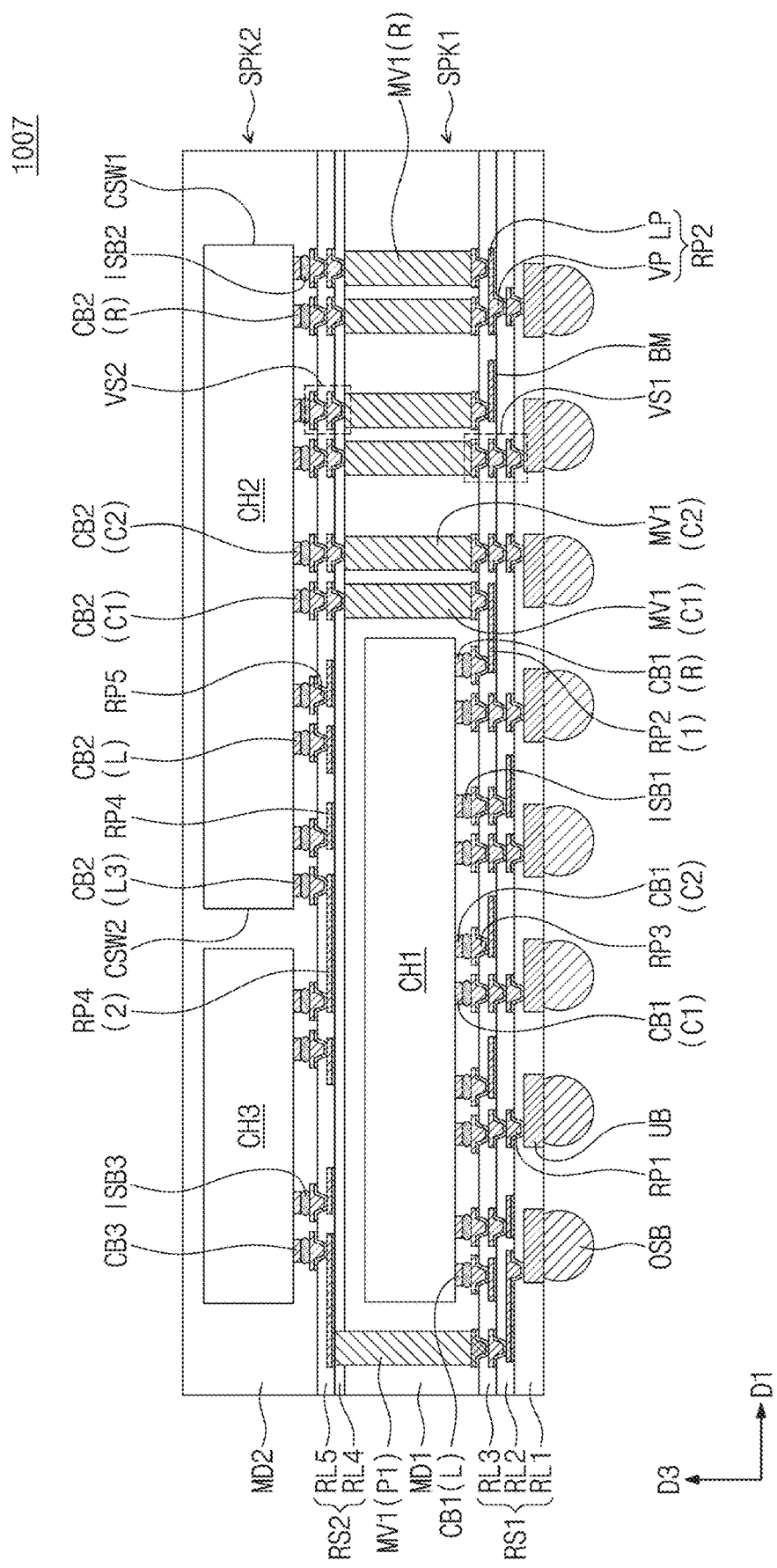
FIG. 10 is a cross-sectional view of a semiconductor package according to some embodiments of the present inventive concepts.

FIG. 10 is a cross-sectional view of a semiconductor package according to some embodiments of the present inventive concepts.

Referring to FIG. 10, a semiconductor package 1007 according to a present embodiment includes a first sub-semiconductor package SPK1 and a second sub-semiconductor package SPK2 that are sequentially stacked. The first sub-semiconductor package SPK1 is the same as or similar to that of FIG. 2A. The second sub-semiconductor package SPK2 further includes a third semiconductor chip CH3 located adjacent to, but spaced apart from, the second chip sidewall CSW2 of the second semiconductor chip CH2. The third semiconductor chip CH3 includes third-chip conductive bumps CB3 that overlap the first semiconductor chip CH1. A third internal connection member ISB3 is used to mount the third semiconductor chip CH3 onto the second redistribution substrate RS2. One RP4(2) of the fourth redistribution patterns RP4 connects the second semiconductor chip CH2 to the third semiconductor chip CH3. Another RP4(3) of the fourth redistribution patterns RP4 connects the third semiconductor chip CH3 to the first-layer first peripheral mold via MV1(P1). The third semiconductor chip CH3 includes internal electrical circuits. The third semiconductor chip CH3 differs from the first and second semiconductor chips CH1 and CH2. The third semiconductor chip CH3 includes silicon and has the same or similar physical or thermal characteristics as those of the first and second semiconductor chips CH1 and CH2, and accordingly it helps suppress or relax warpage of the semiconductor package 1007. For example, the third semiconductor chip CH3 has the same thermal expansion coefficient as the first and second semiconductor chips CH1 and CH2. Other structural features may be identical or similar to that discussed with reference to FIG. 2A.

Figure 11:
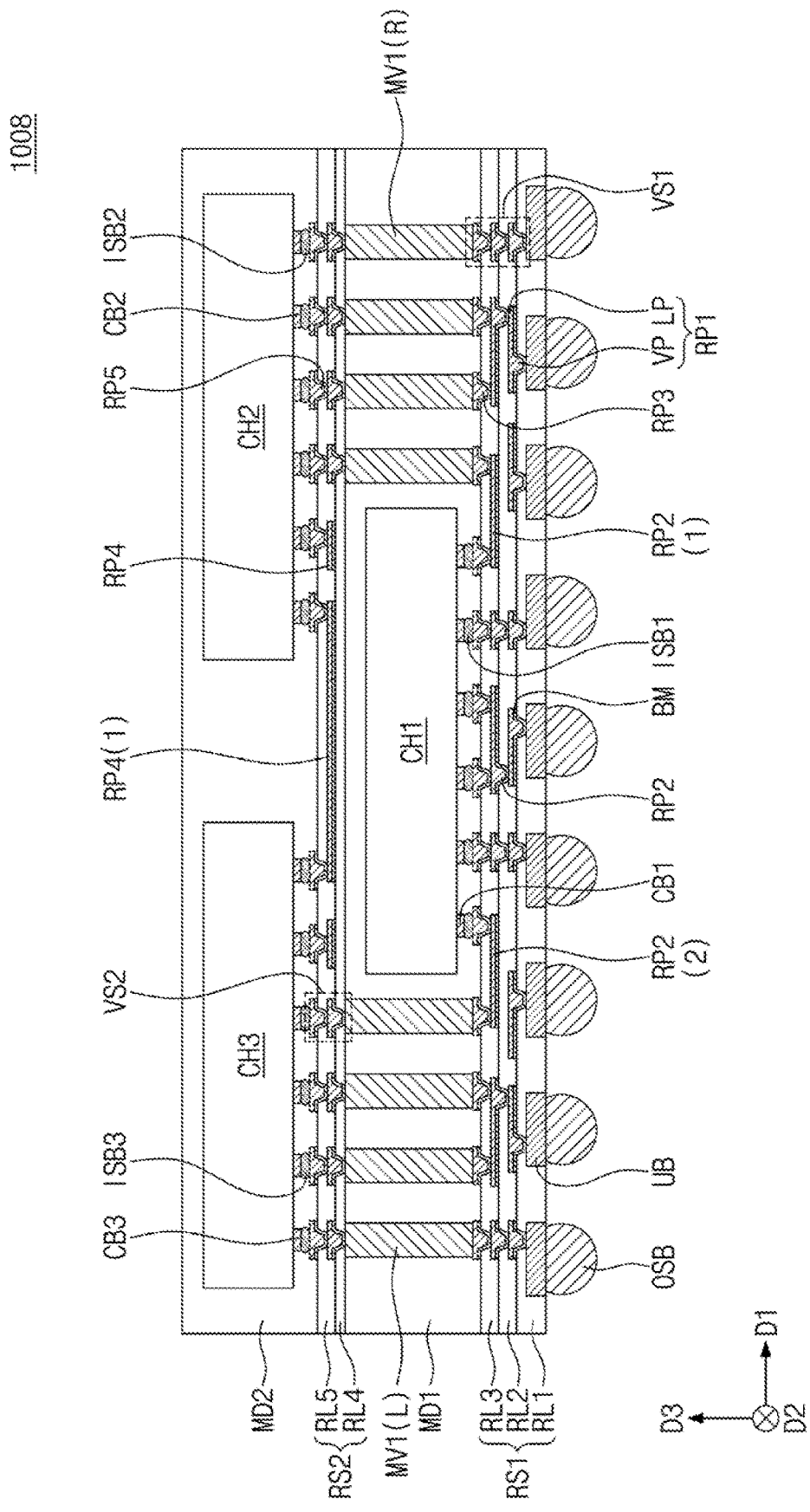
FIG. 11 is a cross-sectional view of a semiconductor package according to some embodiments of the present inventive concepts.

FIG. 11 is a cross-sectional view of a semiconductor package according to some embodiments of the present inventive concepts.

Referring to FIG. 11, a semiconductor package 1008 according to a present embodiment includes a first sub-semiconductor package SPK1 and a second sub-semiconductor package SPK2 that are sequentially stacked. The second sub-semiconductor package SPK2 further includes a third semiconductor chip CH3 located adjacent to, and spaced apart from, a side of the second semiconductor chip CH2. The second semiconductor chip CH2 and the third semiconductor chip CH3 are symmetrically located with respect to the first semiconductor chip CH1. The third semiconductor chip CH3 includes third-chip conductive bumps CB3. A portion of the third semiconductor chip CH3 overlaps the first semiconductor chip CH1, and another portion of the third semiconductor chip CH3 laterally protrudes from the first semiconductor chip CH1. One or more of the third-chip conductive bumps CB3 overlap the first semiconductor chip CH1, and one or more of the other third-chip conductive bumps CB3 do not overlap the first semiconductor chip CH1. The second and third semiconductor chips CH2 and CH3 are electrically connected to each other through one RP4(1) of the fourth redistribution patterns RP4. The first to third semiconductor chips CH1 to CH3 may be the same as or may differ from each other.

As shown in FIG. 11, in an embodiment, the first-layer mold vias MV1 include first-layer right mold vias MV1(R) located on a right side of the first semiconductor chip CH1 and first-layer left mold vias MV1(L) located on a left side of the first semiconductor chip CH1. When viewed in a second direction D2, the first-layer mold vias MV1 are arranged symmetrically about the first semiconductor chip CH1. When viewed in the second direction D2, the number of first-layer mold vias MV1(R) on the right side of the first semiconductor chip CH1 is the same as the number first-layer mold vias MV1(L) on the left side of the first semiconductor chip CH1. As shown in FIG. 11, four first-layer mold vias MV1(R) are located on a right side of the first semiconductor chip CH1, and four first-layer mold via MV1(L) are located on a left side of the first semiconductor chip CH1. The first-layer right mold vias MV1(R) are vertically aligned with corresponding the second conductive bumps CB2 in the second semiconductor chip CH2, and connect the second semiconductor chip CH2 to the first redistribution substrate RS1. The first-layer left mold vias MV1(L) are vertically aligned with corresponding third conductive bumps CB3 in the third semiconductor chip CH3, and connect the third semiconductor chip CH3 to the first redistribution substrate RS1. The first semiconductor chip CH1 is connected to the second semiconductor chip CH2 through one RP2(1) of the second redistribution patterns RP2. The first semiconductor chip CH1 is connected to the third semiconductor chip CH3 through another RP2(2) of the second redistribution patterns RP2. Other structural features are identical or similar to those described above with reference to FIG. 10.

Figure 12:
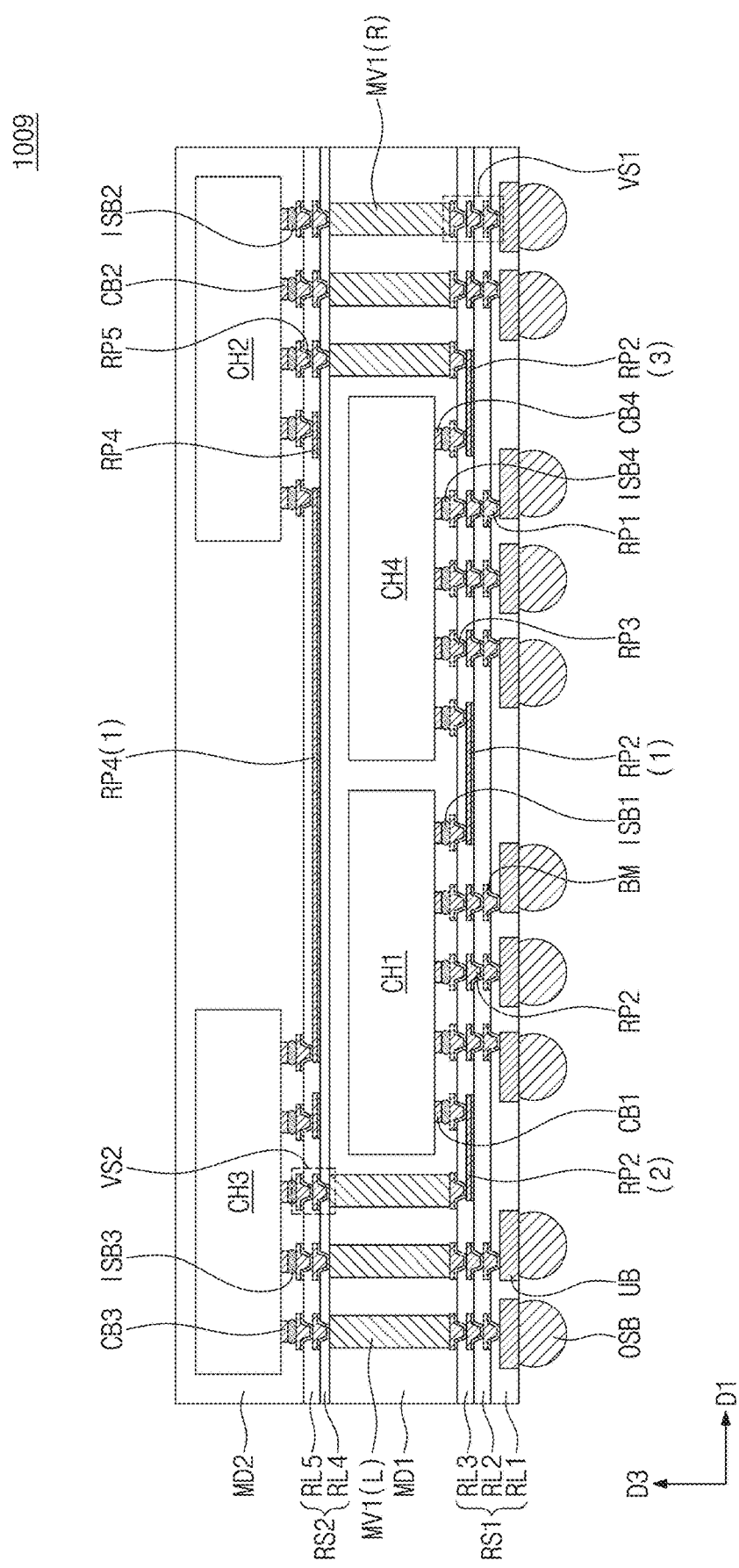
FIG. 12 is a cross-sectional view of a semiconductor package according to some embodiments of the present inventive concepts.

FIG. 12 is a cross-sectional view of a semiconductor package according to some embodiments of the present inventive concepts.

Referring to FIG. 12, a semiconductor package 1009 according to a present embodiment includes a first sub-semiconductor package SPK1 and a second sub-semiconductor package SPK2 that are sequentially stacked. The first sub-semiconductor package SPK1 further includes a fourth semiconductor chip CH4 located adjacent to, and spaced apart from, a side of the first semiconductor chip CH1. The fourth semiconductor chip CH4 includes fourth-chip conductive bumps CB4. A fourth internal connection member ISB4 mounts the fourth semiconductor chip CH4 on the first redistribution substrate RS1. The first and fourth semiconductor chips CH1 and CH4 are connected to each other through one RP2(1) of the second redistribution patterns RP2. The second semiconductor chip CH2 does not overlap the first semiconductor chip CH1. A portion of the second semiconductor chip CH2 overlaps the fourth semiconductor chip CH4, and another portion of the second semiconductor chip CH2 laterally protrudes from the fourth semiconductor chip CH4.

In an embodiment, the second sub-semiconductor package SPK2 further includes a third semiconductor chip CH3 located adjacent to, but spaced apart from, a side of the second semiconductor chip CH2. The third semiconductor chip CH3 includes third-chip conductive bumps CB3. A portion of the third semiconductor chip CH3 overlaps the first semiconductor chip CH1, and another portion of the third semiconductor chip CH3 laterally protrudes from the first semiconductor chip CH1. One or more of the third-chip conductive bumps CB3 overlap the first semiconductor chip CH1, and the remaining third-chip conductive bumps CB3 do not overlap the first semiconductor chip CH1. The second and third semiconductor chips CH2 and CH3 are electrically connected to each other through one RP4(1) of the fourth redistribution patterns RP4. The first to fourth semiconductor chips CH1 to CH4 may be the same as or may differ from each other.

As shown in FIG. 12, in an embodiment, the first-layer mold vias MV1 include first-layer right mold vias MV1(R) located on a right side of the fourth semiconductor chip CH4 and first-layer left mold vias MV1(L) located on a left side of the first semiconductor chip CH1. When viewed in a second direction D2, the first-layer mold vias MV1 are arranged symmetrically about the first semiconductor chip CH1. When viewed in the second direction D2, the number of first-layer mold vias MV1(R) on the right side of the fourth semiconductor chip CH4 is the same as the number first-layer mold vias MV1(L) on the left side of the first semiconductor chip CH1. As shown in FIG. 12, three first-layer mold vias MV1(R) are located on a right side of the fourth semiconductor chip CH4, and three first-layer mold via MV1(L) are located on a left side of the first semiconductor chip CHL The first-layer right mold vias MV1(R) are vertically aligned with corresponding second conductive bumps CB2 in the second semiconductor chip CH2, and connect the second semiconductor chip CH2 to the first redistribution substrate RS1. The first-layer left mold vias MV1(L) are vertically aligned with corresponding third conductive bumps CB3 in the third semiconductor chip CH3, and connect the third semiconductor chip CH3 to the first redistribution substrate RS1. The first semiconductor chip CH1 is connected to the fourth semiconductor chip CH4 through one RP2(1) of the second redistribution patterns RP2. The first semiconductor chip CH1 is connected to the third semiconductor chip CH3 through another RP2(2) of the second redistribution patterns RP2. The fourth semiconductor chip CH4 is connected to the second semiconductor chip CH2 through another RP2(3) of the second redistribution patterns RP2. Other structural features are identical or similar to those discussed above with reference to FIG. 11.

Figure 13:
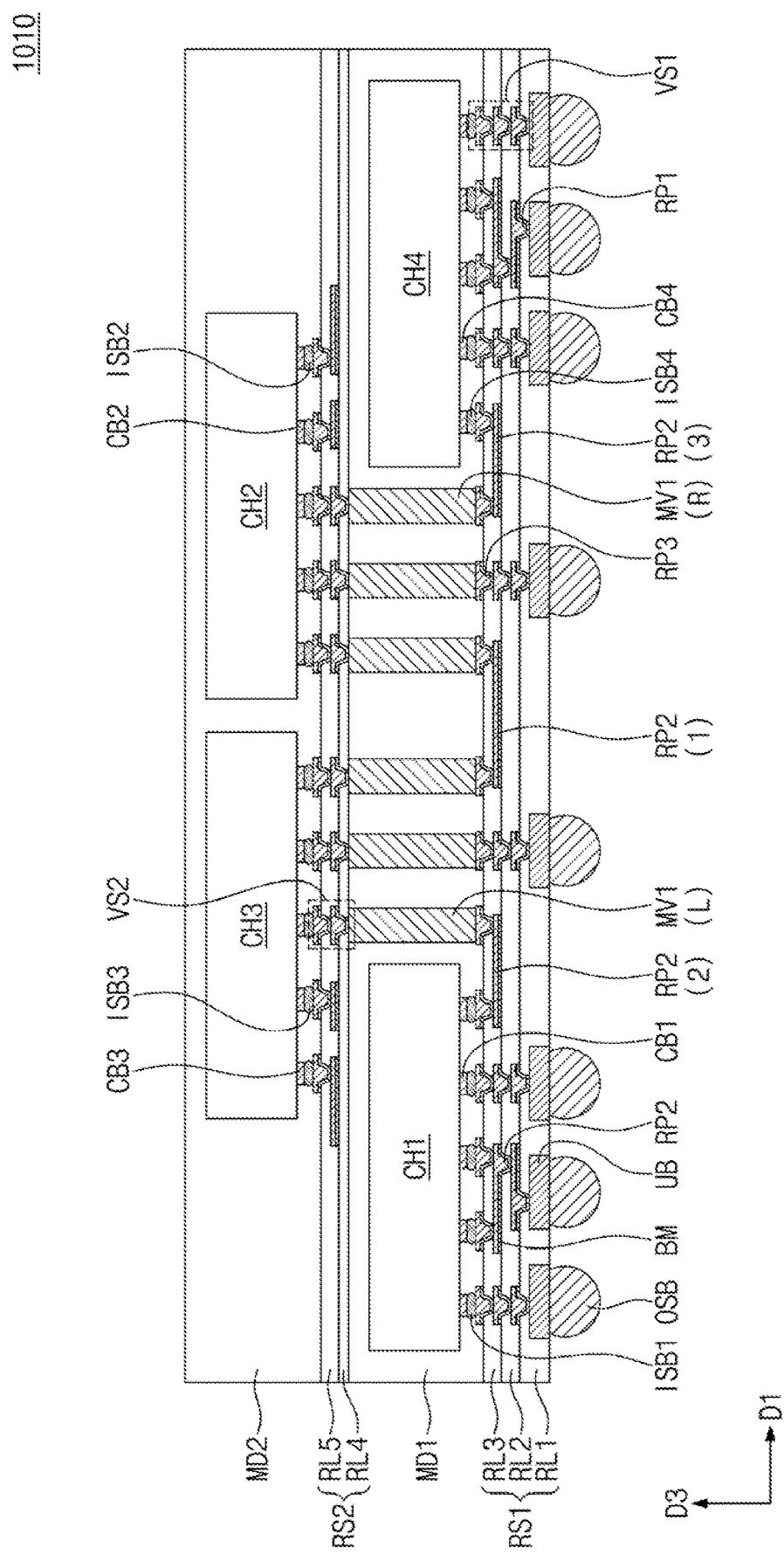
FIG. 13 is a cross-sectional view of a semiconductor package according to some embodiments of the present inventive concepts.

FIG. 13 is a cross-sectional view of a semiconductor package according to some embodiments of the present inventive concepts.

Referring to FIG. 13, a semiconductor package 1010 according to a present embodiment includes a first sub-semiconductor package SPK1 and a second sub-semiconductor package SPK2 that are sequentially stacked. The first sub-semiconductor package SPK1 further includes a fourth semiconductor chip CH4 located adjacent to, and spaced apart from, a side of the first semiconductor chip CH1. The second sub-semiconductor package SPK2 further includes a third semiconductor chip CH3 located adjacent to, and spaced apart from, a side of the second semiconductor chip CH2.

As shown in FIG. 13, in an embodiment, the first-layer mold vias MV1 may include first-layer left mold vias MV1(L) located on a right side of the first semiconductor chip CH1 and first-layer right mold vias MV1(R) located on a left side of the fourth semiconductor chip CH4. In an embodiment, the third semiconductor chip CH3, the first semiconductor chip CH1, and the first-layer left mold vias MV1(L) are symmetrically arranged with respect to the second semiconductor chip CH2, fourth semiconductor chip CH4 and the first-layer right mold vias MV1(R). The first-layer right mold vias MV1(R) are vertically aligned with corresponding second conductive bumps CB2 in the second semiconductor chip CH2, and connect the second semiconductor chip CH2 to the first redistribution substrate RS1. The first-layer left mold vias MV1(L) are vertically aligned with corresponding third conductive bumps CB3 in the third semiconductor chip CH3, and connect the third semiconductor chip CH3 to the first redistribution substrate RS1. The second and third semiconductor chips CH2 and CH3 are electrically connected to each other through one RP2(1) of the second redistribution patterns RP2. The first semiconductor chip CH1 is connected to the third semiconductor chip CH3 through another RP2(2) of the second redistribution patterns RP2. The fourth semiconductor chip CH4 is connected to the second semiconductor chip CH2 through another RP2(3) of the second redistribution patterns RP2. Other configurations are identical or similar to those described above with reference to FIG. 12.

Figure 14A:
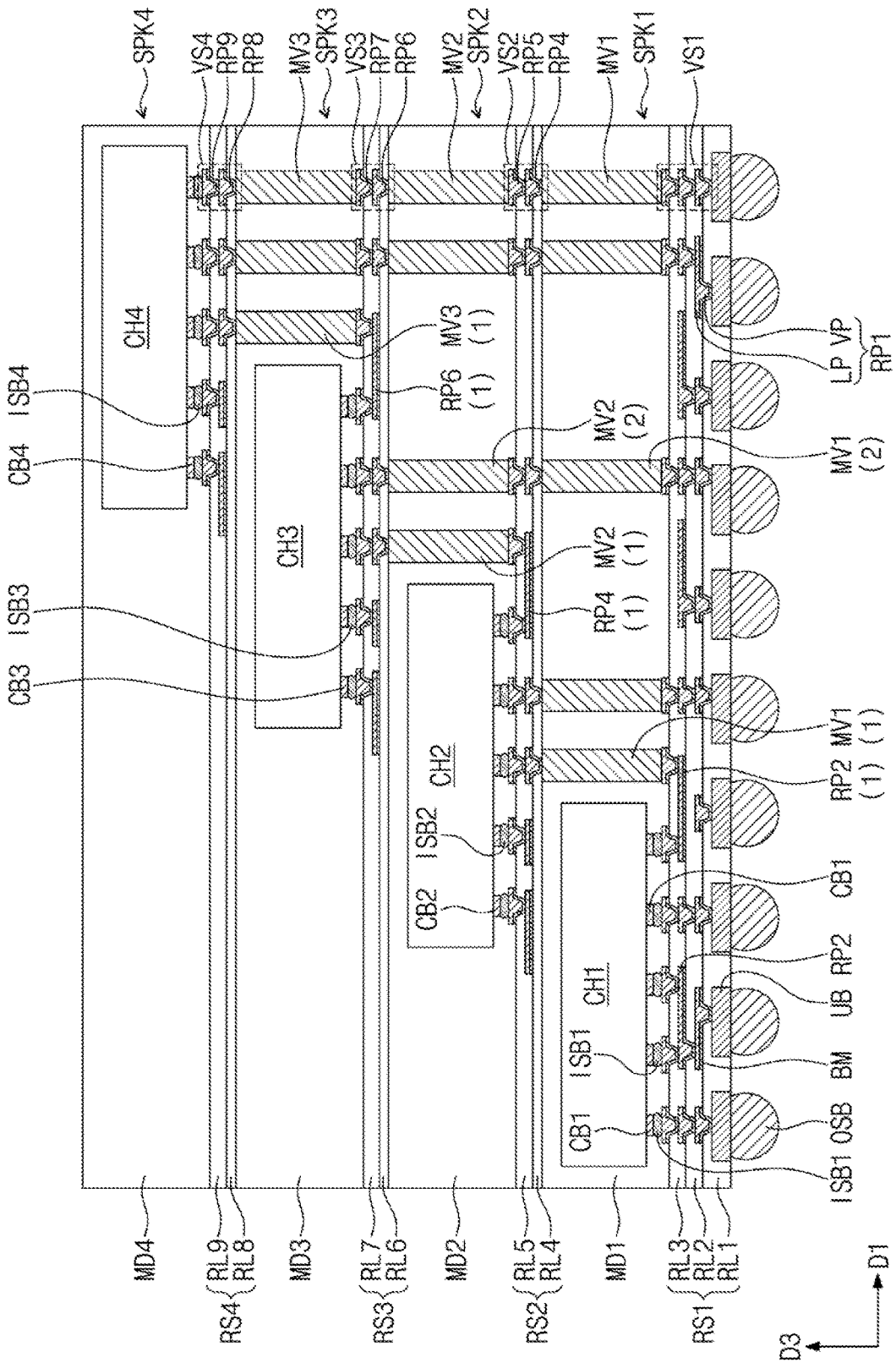
FIG. 14A is a cross-sectional view of a semiconductor package according to some embodiments of the present inventive concepts.

FIG. 14A is a cross-sectional view of a semiconductor package according to some embodiments of the present inventive concepts.

Referring to FIG. 14A, a semiconductor package 1011 according to a present embodiment includes first, second, third, and fourth sub-semiconductor packages SPK1, SPK2, SPK3, and SPK4 that are sequentially stacked. The first sub-semiconductor package SPK1 is the same as or similar to that of FIG. 2A, and this also holds true for the second sub-semiconductor package SPK2. The second sub-semiconductor package SPK2 further includes second-layer mold vias MV2. The third sub-semiconductor package SPK3 includes a third redistribution substrate RS3, a third semiconductor chip CH3, a third mold layer MD3, and third-layer mold vias MV3. The third redistribution substrate RS3 includes a sixth redistribution dielectric layer RL6, a seventh redistribution dielectric layer RL7, a sixth redistribution pattern RP6, and a seventh redistribution pattern RP7 that are sequentially stacked. The fourth sub-semiconductor package SPK4 includes a fourth redistribution substrate RS4, a fourth semiconductor chip CH4, and a fourth mold layer MD4. The fourth redistribution substrate RS4 includes an eighth redistribution dielectric layer RL8, a ninth redistribution dielectric layer RL9, an eighth redistribution pattern RP8, and a ninth redistribution pattern RP9 that are sequentially stacked. The first to fourth semiconductor chips CH1 to CH4 are offset from each other in the first direction D1. The first to fourth semiconductor chips CH1 to CH4 have a stepwise shape.

In an embodiment, the third semiconductor chip CH3 is electrically connected to the second semiconductor chip CH2 through one MV2(1) of the second-layer mold vias MV2 and one RP4(1) of the fourth redistribution patterns RP4. The fourth semiconductor chip CH4 is electrically connected to the third semiconductor chip CH3 through one MV3(1) of the third-layer mold vias MV3 and one RP6(1) of the sixth redistribution patterns RP6. The third semiconductor chip CH3 is electrically connected to the first redistribution substrate RS1 through one MV2(2) of the second-layer mold vias MV2 and another MV1(2) of the first-layer mold vias MV1, and the second-layer mold via MV2(2) and the first-layer mold via MV1(2) are vertically aligned with each other. The fourth semiconductor chip CH4 is electrically connected to the first redistribution substrate RS1 through the first to third-layer mold vias MV1 to MV3 that are vertically aligned with each other. Other configurations are identical or similar to those described with reference to FIGS. 1 to 13.

Figure 14B:
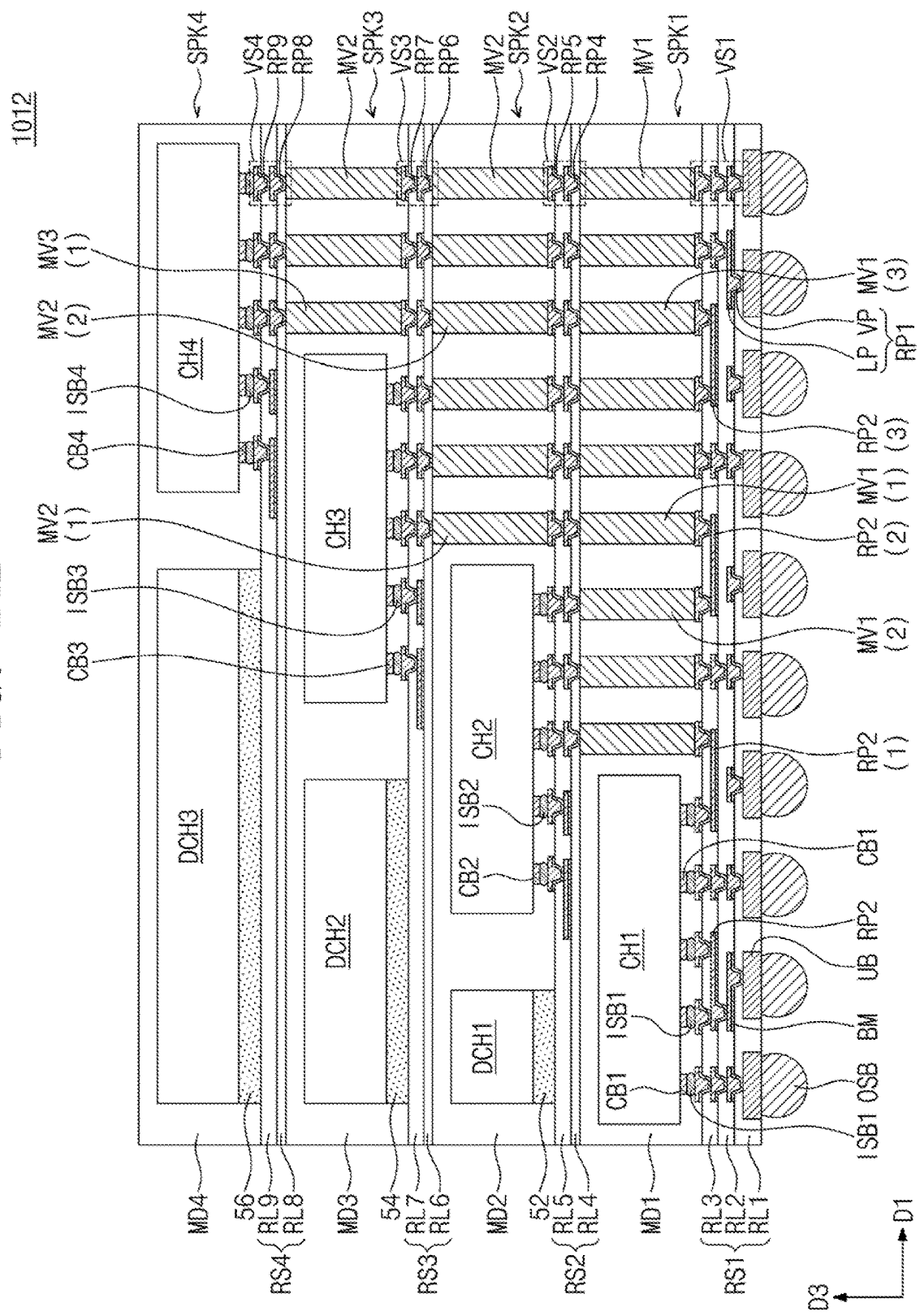
FIG. 14B is a cross-sectional view of a semiconductor package according to some embodiments of the present inventive concepts.

FIG. 14B is a cross-sectional view of a semiconductor package according to some embodiments of the present inventive concepts.

Referring to FIG. 14B, a semiconductor package 1012 according to a present embodiment includes first, second, third, and fourth sub-semiconductor packages SPK1, SPK2, SPK3, and SPK4. The first sub-semiconductor package SPK1 is the same as or similar to that of FIG. 14A, and this also holds true for the second sub-semiconductor package SPK2. The second sub-semiconductor package SPK2 is similar to that of the second sub-semiconductor package SPK2 of FIG. 14A, and further includes a first dummy semiconductor chip DCH1 and a first adhesive layer 52. The third sub-semiconductor package SPK3 is similar to that of the third sub-semiconductor package SPK3 of FIG. 14A, and further includes a second dummy semiconductor chip DCH2 and a second adhesive layer 54. The fourth sub-semiconductor package SPK4 is similar to that of the fourth sub-semiconductor package SPK4 of FIG. 14A, and further includes a third dummy semiconductor chip DCH3 and a third adhesive layer 56. The widths of the first to third dummy semiconductor chips DCH1 to DCH3 differ from each other. For example, the width of the second dummy semiconductor chip DCH2 is greater than that of the first dummy semiconductor chip DCH1 and less than that of the third dummy semiconductor chip DCH3.

In an embodiment, the third semiconductor chip CH3 is electrically connected to the second semiconductor chip CH2 through one MV2(1) of the second-layer mold vias MV2, one MV1(1) of the first-layer mold vias MV1, one RP2(2) of the second redistribution patterns RP2, and another MV1(2) of the first-layer mold vias MV1. The fourth semiconductor chip CH4 is electrically connected to the third semiconductor chip CH3 through one MV3(1) of the third-layer mold vias MV3, another MV2(2) of the second-layer mold vias MV2, another MV1(3) of the first-layer mold vias MV1, and another RP2(3) of the second redistribution patterns RP2. Other structural features are identical or similar to those described with reference to FIG. 14A.

In a present embodiment, at least one of the first to third dummy semiconductor chips DCH1 to DCH3 of FIG. 14B can be replaced with an arbitrary semiconductor chip that actually functions, such as the third semiconductor chip CH3 of FIG. 10.

Figure 15:
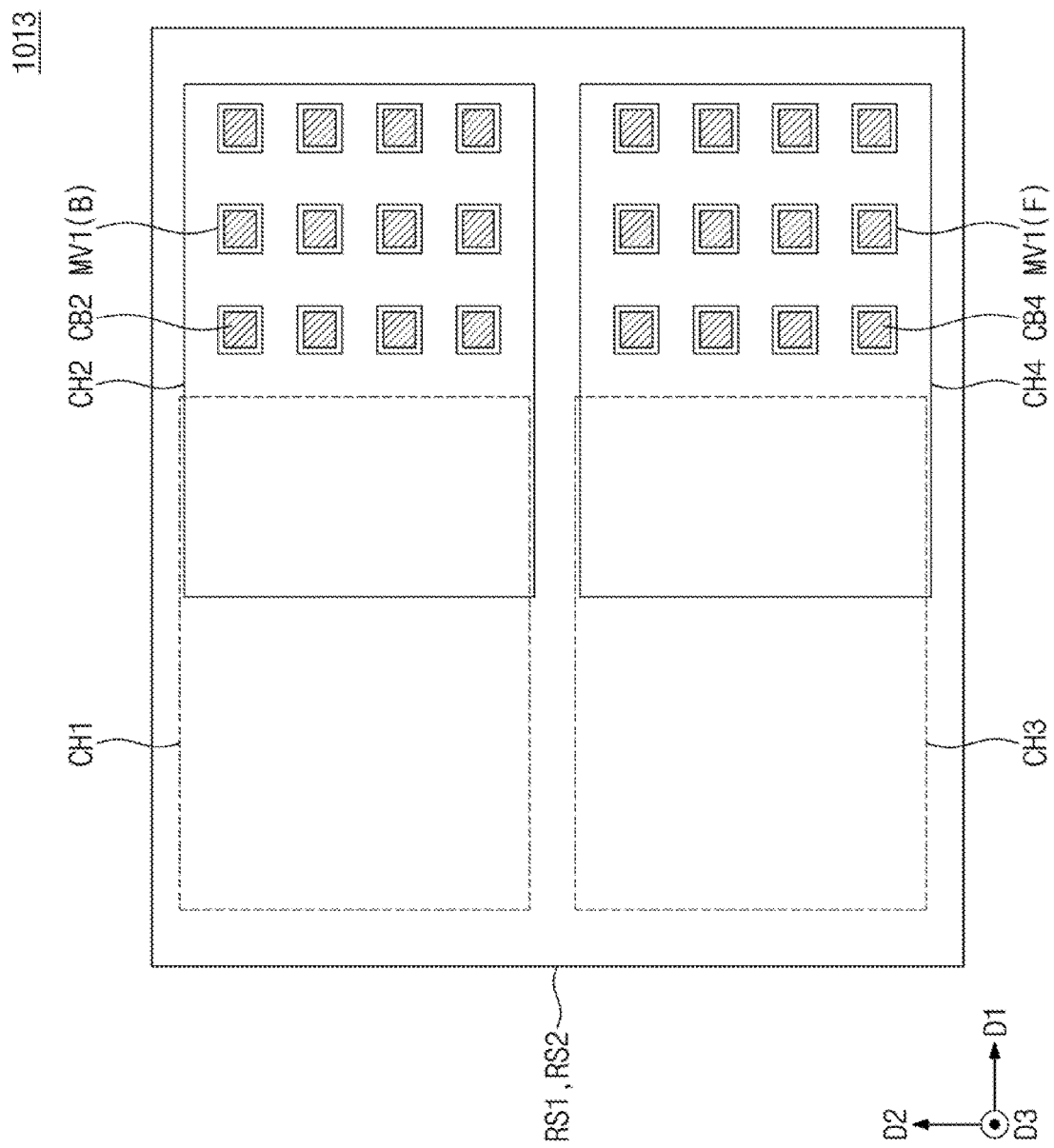
FIG. 15 is a plan view of a semiconductor package according to some embodiments of the present inventive concepts.

FIG. 15 is a plan view of a semiconductor package according to some embodiments of the present inventive concepts.

Referring to FIGS. 2A and 15, a semiconductor package 1013 according to a present embodiment includes a first sub-semiconductor package SPK1 and a second sub-semiconductor package SPK2 that are sequentially stacked. The first sub-semiconductor package SPK1 includes a first semiconductor chip CH1 and a third semiconductor chip CH3 that are mounted side by side in the second direction D2 on the first redistribution substrate RS1. The second sub-semiconductor package SPK2 includes a second semiconductor chip CH2 and a fourth semiconductor chip CH4 that are mounted side by side in the second direction D2 on the second redistribution substrate RS2. The first sub-semiconductor package SPK1 includes first-layer backside mold vias MV1(B) that penetrate the first mold layer MD1 and overlap the second-chip conductive bumps CB2 in the third semiconductor chip CH3. A portion of the second semiconductor chip CH2 overlaps the first semiconductor chip CH1. A portion of the fourth semiconductor chip CH4 overlaps the third semiconductor chip CH3. The first sub-semiconductor package SPK1 includes first-layer front-side mold vias MV1(F) that penetrate the first mold layer MD1 and overlap the fourth-chip conductive bumps CB4 in the fourth semiconductor chip CH4. Other configurations may be identical or similar to those described with reference to FIGS. 1 to 3B.

Figure 16A:
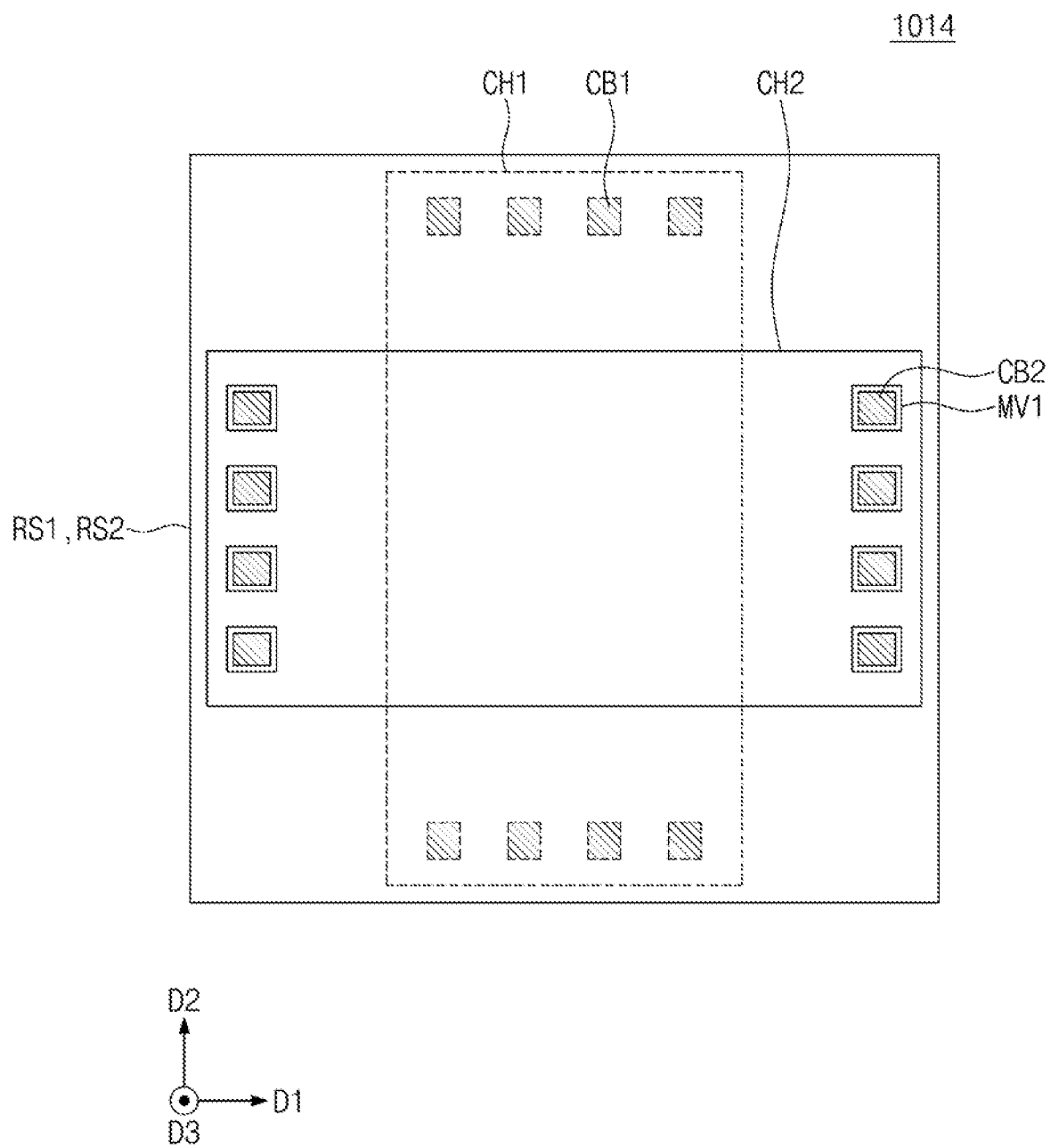
FIG. 16A is a plan view of a semiconductor package according to some embodiments of the present inventive concepts.
Figure 16B:
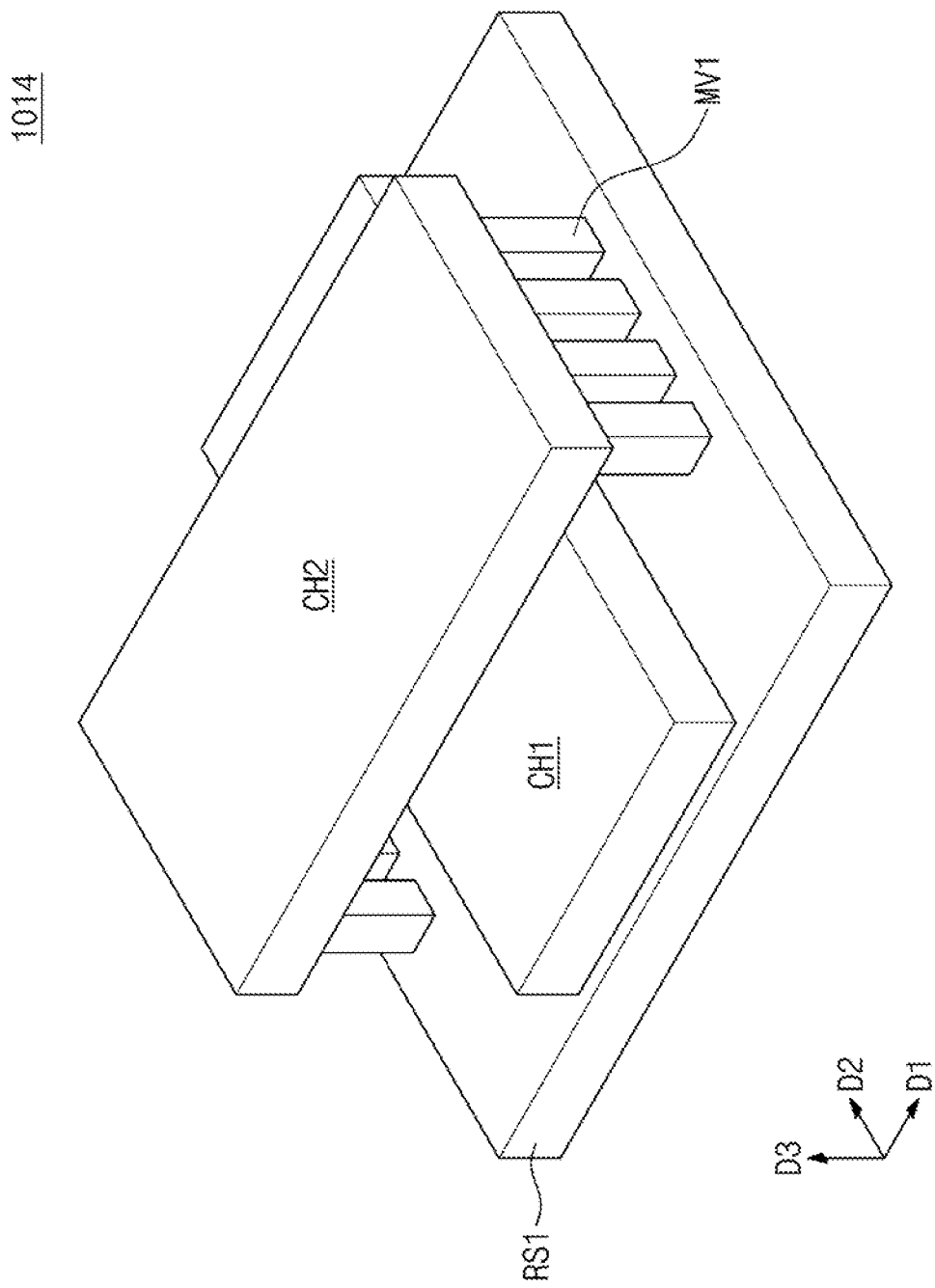
FIG. 16B is a perspective view of a semiconductor package with the plan view of FIG. 16A.

FIG. 16A is a plan view of a semiconductor package according to some embodiments of the present inventive concepts. FIG. 16B is a perspective view of a semiconductor package shown in FIG. 16A. For clarity of illustration, the second redistribution substrate RS2 is omitted from FIG. 16B.

Referring to FIGS. 16A and 16B, a semiconductor package 1014 according to a present embodiment is configured such that the second semiconductor chip CH2 intersects the first semiconductor chip CH1. The second semiconductor chip CH2 is elongated in the first direction D1, and the second-chip conductive bumps CB2 are located adjacent to opposite sides of the second semiconductor chip CH2. The first semiconductor chip CH1 is elongated in the second direction D2, and the first-chip conductive bumps CB1 are located adjacent to opposite sides of the first semiconductor chip CH1. The second-chip conductive bumps CB2 do not overlap the first semiconductor chip CH1, and are exposed on opposite sides of the first semiconductor chip CH1. The first-layer mold vias MV1 are located on opposite sides of the first semiconductor chip CH1. Other configurations are identical or similar to those discussed with reference to FIGS. 1 to 3B.

Figure 17:
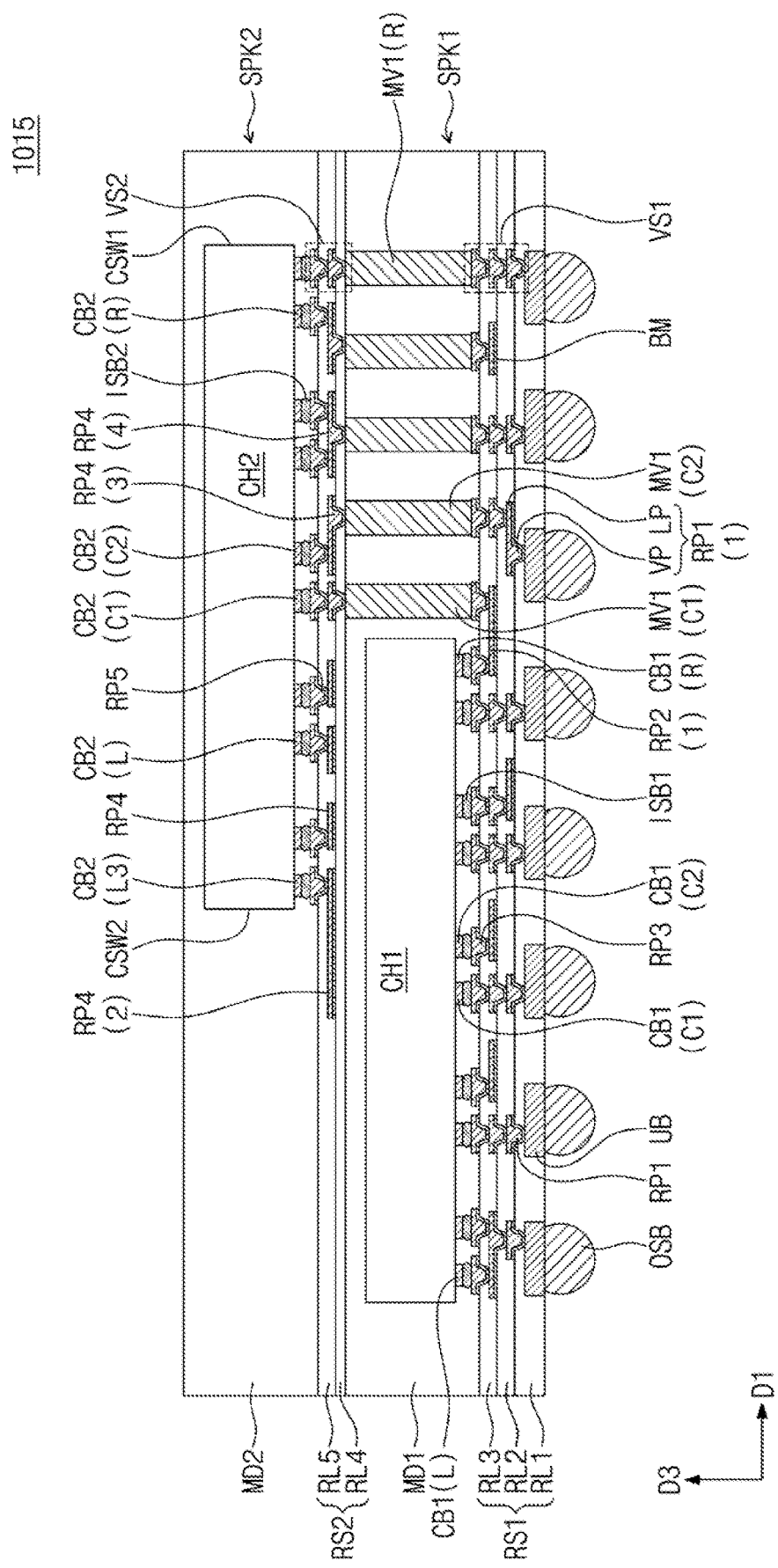
FIG. 17 is a cross-sectional view of a semiconductor package according to some embodiments of the present inventive concepts.

FIG. 17 is a cross-sectional view of a semiconductor package according to some embodiments of the present inventive concepts.

Referring to FIG. 17, a semiconductor package 1015 according to a present embodiment includes a first sub-semiconductor package SPK1 and a second sub-semiconductor package SPK2 that are sequentially stacked. The first sub-semiconductor package SPK1 includes a first redistribution substrate RS1, a first semiconductor chip CH1, a first mold layer MD1, and first-layer mold vias MV1. The second sub-semiconductor package SPK2 includes a second redistribution substrate RS2, a second semiconductor chip CH2, and a second mold layer MD2. The first sub-semiconductor package SPK1 is the same as or similar to that of FIGS. 1 to 3B, and this also holds true for the second sub-semiconductor package SPK2.

In a present embodiment, an interval between the second-chip conductive bumps CB2 differs from that between the first-layer mold vias MV1. A second-chip second central conductive bump CB2(C2) of the second semiconductor chip CH2 is connected to a first-layer second central mold via MV1(C2) through the line part LP of one RP4(3) of the fourth redistribution patterns RP4. The second-chip second central conductive bump CB2(C2) is not vertically aligned with the first-layer second central mold via MV1(C2). The first-layer second central mold via MV1(C2) is connected to one of the under-bumps UB through one RP1(1) of the first redistribution patterns RP1. The first-layer second central mold via MV1(C2) is be vertically aligned with the via part VP of the one RP(1) of the first redistribution patterns RP1.

In a present embodiment, neighboring second-chip right conductive bumps CB2(R) in the second semiconductor chip CH2 are connected to each other through the line part LP of another RP4(4) of the fourth redistribution patterns RP4 and are thus connected to one of the first-layer right mold vias MV1(R).

In a present embodiment, one of the second-chip right conductive bumps CB2(R) is vertically aligned with another of the first-layer right mold vias MV1(R), the first via structure VS1, and the second via structure VS2. Other configurations are identical or similar to those described with reference to FIGS. 1 to 3B.

As described above, the semiconductor package 1015 of FIG. 17 is configured such that redistribution patterns overcome a pitch and arrangement of the mold vias MV1 and facilitate routing with the external connection terminals OSB, which increases the degree of freedom of wiring.

According to embodiments of the present inventive concepts, no through via is included in semiconductor chips of a semiconductor package, and thus sizes of the semiconductor chips and production costs can be reduced. In addition, a semiconductor package according to an embodiment of the present inventive concepts includes stacked semiconductor chips that partially overlap each other to reduce a size of the semiconductor package and to exhibit high capacity and excellent performance. Moreover, mold vias connect the semiconductor chips located at upper positions, which reduces a signal delivery distance, increases operating speed and the degree of freedom of wiring.

Although some embodiments of the present inventive concepts illustrated in the accompanying drawings have been described, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of embodiments of the present inventive concepts. Embodiments of FIGS. 1 to 17 may be combined with each other.

What is claimed is:

1. A semiconductor package, comprising:
    a first redistribution substrate;
    a first semiconductor chip disposed on the first redistribution substrate;
    a first mold layer that covers the first semiconductor chip and the first redistribution substrate;
    a second redistribution substrate disposed on the first mold layer;
    a second semiconductor chip disposed on the second redistribution substrate, wherein the second semiconductor chip includes
        a second-chip first conductive bump that does not overlap the first semiconductor chip,
        a first sidewall that overlaps the first semiconductor chip, and
        a second sidewall that does not overlap the first semiconductor chip,
    wherein the first sidewall and the second sidewall are opposite to each other; and
    a first mold via that penetrates the first mold layer and connects the second-chip first conductive bump to the first redistribution substrate,
    wherein the first mold via overlaps the second-chip first conductive bump.

2. The semiconductor package of claim 1, wherein
    the first redistribution substrate includes a first via structure connected to the first mold via,
    the second redistribution substrate includes a second via structure connected to the second-chip first conductive bump, and
    the second-chip first conductive bump, the second via structure, the first mold via, and the first via structure are vertically aligned with each other.

3. The semiconductor package of claim 2, wherein each of the first via structure and the second via structure includes a plurality of stacked vias.

4. The semiconductor package of claim 1, further comprising:
    a dummy semiconductor chip disposed on the second redistribution substrate and adjacent to the first sidewall of the second semiconductor chip, wherein the dummy semiconductor chip overlaps the first semiconductor chip; and
    an adhesive layer interposed between the dummy semiconductor chip and the second redistribution substrate.

5. The semiconductor package of claim 4, wherein the dummy semiconductor chip includes silicon and is not electrically connected to the second redistribution substrate.

6. The semiconductor package of claim 1, wherein
    the first semiconductor chip includes a first-chip first conductive bump and a first-chip second conductive bump that are spaced apart from each other, and
    the first redistribution substrate includes:
        a first redistribution pattern that connects the first mold via to the first-chip first conductive bump; and
        a via structure connected to the first-chip second conductive bump and spaced apart from the first redistribution pattern, wherein the via structure overlaps the first-chip second conductive bump.

7. The semiconductor package of claim 1, further comprising:
    a second mold layer that covers the second semiconductor chip;
    a third redistribution substrate disposed on the second mold layer;
    a third semiconductor chip disposed on the third redistribution substrate wherein the third semiconductor Chip includes a third-chip conductive bump;
    a second mold via that penetrates the first mold layer and is spaced apart from the first mold via; and
    a third mold via that penetrates the second mold layer, wherein the first to third semiconductor chips are offset from each other in a first direction, wherein the second mold via and the third mold via are connected to the third-chip conductive bump, and wherein the third-chip conductive bump, the third mold via, and the second mold via are vertically aligned with each other.

8. The semiconductor package of claim 1, further comprising a second mold via spaced apart from the first mold via, wherein the second mold via penetrates the first mold layer at a location that does not overlap either of the first semiconductor chip or the second semiconductor chip, wherein the second semiconductor chip has a second-chip second conductive bump and a second-chip third conductive bump that are spaced apart from the second-chip first conductive bump, and wherein the second redistribution substrate includes a redistribution pattern that connects the second-chip first conductive bump and the second-chip second conductive bump to the second mold via.

9. The semiconductor package of claim 1, further comprising:

a third semiconductor chip disposed on the second redistribution substrate and that is spaced apart from the second semiconductor chip; and a second mold via that penetrates the first mold layer and connects the third semiconductor chip to the first redistribution substrate, wherein the third semiconductor chip includes a third-chip conductive bump that does not overlap the first semiconductor chip, and wherein the third-chip conductive bump overlaps the second mold via.

10. The semiconductor package of claim 1, further comprising:

a third semiconductor chip disposed on the second redistribution substrate and at a side of the second semiconductor chip;

a fourth semiconductor chip on the first redistribution substrate and at a side of the first semiconductor chip; and a second mold via that penetrates the first mold layer and connects the third semiconductor chip to the first redistribution substrate, wherein the third semiconductor chip includes a third-chip conductive bump connected to the second mold via, and wherein the second mold via and the third-chip conductive bump are vertically aligned with each other.

11. The semiconductor package of claim 1, further comprising a second mold via that penetrates the first mold layer and is spaced apart from the first mold via, wherein the second semiconductor chip further includes a second-chip second conductive bump that does not overlap the first semiconductor chip, wherein the second-chip second conductive bump is spaced apart from the second-chip first conductive bump and connected to the second mold via, and wherein the first redistribution substrate includes a redistribution pattern that connects the first mold via to the second mold via.

12. A semiconductor package, comprising:
a first redistribution substrate;
a first semiconductor chip disposed on the first redistribution substrate;
a first mold layer that covers the first semiconductor chip and the first redistribution substrate;

a second redistribution substrate disposed on the first mold layer;

a second semiconductor chip disposed on the second redistribution substrate, wherein a portion of the second semiconductor chip overlaps a portion of the first semiconductor chip;

a first mold via at a side of the first semiconductor chip, wherein the first mold via penetrates the first mold layer and overlaps the second semiconductor chip; and a second mold via spaced apart from the first mold via, wherein the second mold via penetrates the first mold layer at a location that does not overlap either of the first semiconductor chip or the second semiconductor chip, wherein the second semiconductor chip includes:
a second-chip first conductive bump that does not overlap the first semiconductor chip and is connected to the first mold via; and
a second-chip second conductive bump that overlaps the first semiconductor chip and is connected to the second mold via, wherein the first mold via overlaps the second-chip first conductive bump, wherein the second redistribution substrate includes a redistribution pattern that connects the second-chip second conductive bump to the second mold via, wherein the second semiconductor chip has a first width in a first direction, wherein a portion of the second semiconductor chip has a second width in the first direction, the portion of the second semiconductor chip overlapping the first semiconductor chip, and wherein the second width is about 10% to about 90% of the first width.

13. The semiconductor package of claim 12, wherein
the first redistribution substrate includes a first via structure connected to the first mold via,
the second redistribution substrate includes a second via structure connected to the second-chip first conductive bump, and
the second-chip first conductive bump, the second via structure, the first mold via, and the first via structure are vertically aligned with each other.

14. The semiconductor package of claim 13, further comprising a solder ball bonded to the first redistribution substrate and connected to the first via structure, wherein the first redistribution substrate further includes an under-bump between the first via structure and the solder ball, and the first via structure, the under-hump, and the solder ball are vertically aligned with each other.

15. The semiconductor package of claim 12, further comprising:

a dummy semiconductor chip disposed on the second redistribution substrate and adjacent to one sidewall of the second semiconductor chip, wherein the dummy semiconductor chip overlaps the first semiconductor chip; and an adhesive layer interposed between the dummy semiconductor chip and the second redistribution substrate.

16. The semiconductor package of claim 12, wherein the second semiconductor chip has a first width in a first direction, wherein the portion of the second semiconductor chip that overlaps the portion of the first semiconductor chip has a second width in the first direction, and wherein the second width ranges from about 10% to about 90% of the first width.

17. A semiconductor package, comprising;
a first redistribution substrate, a first semiconductor chip, a second redistribution substrate, a second semiconductor chip, a third redistribution substrate, and a third semiconductor chip that are sequentially stacked;
a first mold layer interposed between the first redistribution substrate and the second redistribution substrate;
a second mold layer interposed between the second redistribution substrate and the third redistribution substrate;
a first mold via and a second mold via that penetrate the first mold layer and are spaced apart from each other; and
a third mold via that penetrates the second mold layer,
wherein the first semiconductor chip, the second semiconductor chip, and the third semiconductor chip are offset from each other in a first direction,
wherein the second semiconductor chip is connected through the first mold via to the first redistribution substrate, and
wherein the third semiconductor chip is connected to the first redistribution substrate through the third mold via and the second mold via, wherein the third mold via and the second mold via are vertically aligned with each other.

18. The semiconductor package of claim 17,
wherein the second semiconductor chip includes a second-chip conductive bump connected to the first mold via, and
wherein the second-chip conductive bump and the first mold via are vertically aligned with each other.

19. The semiconductor package of claim 17,
wherein the third semiconductor chip includes a third-chip conductive bump connected to the third mold via,
wherein the second mold via, the third mold via, and the third-chip conductive bump are vertically aligned with each other.

20. The semiconductor package of claim 17, wherein
the first redistribution substrate includes a redistribution pattern that connects the first mold via to the second mold via, and
the third semiconductor chip is electrically connected to the second semiconductor chip through the third mold via, the second mold via, the redistribution pattern, and the first mold via.

* * * * *